(12) United States Patent
Ruhnke

(10) Patent No.: US 10,103,531 B1
(45) Date of Patent: Oct. 16, 2018

(54) COMPONENT MOUNTING DEVICES, SYSTEMS, AND METHODS

(71) Applicant: William Ruhnke, Brooklyn, NY (US)

(72) Inventor: William Ruhnke, Brooklyn, NY (US)

(73) Assignee: Vpulse Inc., Brooklyn, NY (US)

( * ) Notice: Subject to any disclaimer, the term of this patent is extended or adjusted under 35 U.S.C. 154(b) by 0 days.

(21) Appl. No.: 15/183,009

(22) Filed: Jun. 15, 2016

Related U.S. Application Data

(63) Continuation-in-part of application No. 14/479,346, filed on Sep. 7, 2014, and a continuation-in-part of application No. 13/897,299, filed on May 17, 2013.

(60) Provisional application No. 61/875,667, filed on Sep. 9, 2013, provisional application No. 61/688,553, filed on May 17, 2012.

(51) Int. Cl.
| | | |
|---|---|---|
| *H02G 3/08* | (2006.01) | |
| *H02G 1/00* | (2006.01) | |
| *H05K 5/02* | (2006.01) | |
| *H05K 7/12* | (2006.01) | |
| *H05K 7/14* | (2006.01) | |

(52) U.S. Cl.
CPC .............. *H02G 3/083* (2013.01); *H02G 1/00* (2013.01); *H02G 3/081* (2013.01); *H05K 5/0243* (2013.01); *H05K 7/12* (2013.01); *H05K 7/14* (2013.01)

(58) Field of Classification Search
CPC .......... H02G 3/083; H02G 1/00; H02G 3/081; H05K 5/0243; H05K 7/12; H05K 7/14
USPC ....................................................... 174/135
See application file for complete search history.

(56) References Cited

U.S. PATENT DOCUMENTS

| | | | |
|---|---|---|---|
| 3,610,810 A | 10/1971 | Fribley, Jr. | |
| 4,163,867 A | 8/1979 | Breidenbach | |
| 4,269,379 A | 5/1981 | McCormick | |
| 4,406,379 A | 9/1983 | Anderson et al. | |
| 4,721,268 A | 1/1988 | Lerner et al. | |
| 5,252,086 A | 10/1993 | Russell et al. | |
| 5,368,261 A | 11/1994 | Caveney et al. | |
| 5,640,912 A | 6/1997 | Diffrient | |
| 5,934,636 A | 8/1999 | Cyrell | |
| 5,971,508 A | 10/1999 | Deimen et al. | |
| 6,179,665 B1 * | 1/2001 | Rossman ............... | H01R 13/72 439/131 |
| 6,192,805 B1 | 2/2001 | Saylor et al. | |
| 6,312,278 B1 | 11/2001 | Prior | |
| 6,329,597 B1 | 12/2001 | Kaloustian | |
| 6,379,182 B1 | 4/2002 | Byrne | |

(Continued)

OTHER PUBLICATIONS

"Cable Management Catalog," Belden Inc., USA, 2009, p. 42, Retrieved from the Internet: URL<http://www.belden.com/pdfs/Catalogs/CableMgmtCat.pdf>. 80 pages.

(Continued)

*Primary Examiner* — Jenny L Wagner
*Assistant Examiner* — Michael P McFadden
(74) *Attorney, Agent, or Firm* — Fish & Richardson P.C.

(57) ABSTRACT

A component management system that can be customized by a user is provided. In some embodiments, the component management system includes a cover having first, second and third sides and a substantially uniform thickness, and a mounting panel having first and second major faces and first and second channels extending along opposite edges of the first and second major faces.

19 Claims, 22 Drawing Sheets

(56) References Cited

U.S. PATENT DOCUMENTS

| | | | |
|---|---|---|---|
| 6,541,705 | B1 | 4/2003 | McGrath |
| 6,669,151 | B2 | 12/2003 | Mascadri |
| 7,098,406 | B1 | 8/2006 | Hammonds |
| 7,446,260 | B2 * | 11/2008 | Hammonds ............ B65H 75/06 174/135 |
| D592,487 | S | 5/2009 | Tedesco et al. |
| D592,938 | S | 5/2009 | Pae et al. |
| 7,661,966 | B2 | 2/2010 | Ohanesian |
| D630,167 | S | 1/2011 | Donowho |
| D635,935 | S | 4/2011 | Donowho |
| 7,931,241 | B2 | 4/2011 | Logan et al. |
| 8,009,956 | B2 | 8/2011 | Weinegger et al. |
| D651,570 | S | 1/2012 | Donowho et al. |
| 8,093,499 | B2 | 1/2012 | Hoffer et al. |
| 8,134,075 | B1 | 3/2012 | Vail |
| 8,141,825 | B2 | 3/2012 | Logan et al. |
| 8,155,494 | B2 | 4/2012 | Krampotich et al. |
| 8,221,169 | B2 | 7/2012 | Ahmed |
| D670,152 | S | 11/2012 | Gordon |
| 8,387,215 | B2 | 3/2013 | Koncelik, Jr. |
| 8,403,154 | B2 | 3/2013 | Smith et al. |
| 8,407,863 | B2 | 4/2013 | Cheng |
| D689,760 | S | 9/2013 | Chen |
| D705,043 | S | 5/2014 | Michaud et al. |
| D730,719 | S | 6/2015 | Sundberg |
| D732,373 | S | 6/2015 | Wagner |
| D746,122 | S | 12/2015 | Stoops |
| D747,177 | S | 1/2016 | McGinty et al. |
| D752,954 | S | 4/2016 | Lax et al. |
| D764,259 | S | 8/2016 | Schoening et al. |
| D774,874 | S | 12/2016 | Wentzel et al. |
| D801,793 | S | 11/2017 | Johnson et al. |
| D805,240 | S | 12/2017 | Akiyama |
| 2004/0040125 | A1 | 3/2004 | Schultz |
| 2005/0231080 | A1 | 10/2005 | Torrance |
| 2006/0289710 | A1 | 12/2006 | Bentrim |
| 2007/0047892 | A1 | 3/2007 | Bayazit et al. |
| 2007/0235222 | A1 | 10/2007 | Hubbard |
| 2009/0153770 | A1 * | 6/2009 | Martin ..................... H02G 3/04 349/58 |
| 2013/0068919 | A1 | 3/2013 | Antonioni |

OTHER PUBLICATIONS

APC.com' [online]. "NetShelter Zero U Accessory Mounting Bracket," Retrieved from Feb. 28, 2016. Retrieved from the Internet: URL<https://web.archive.org/web/20160228233932/http://www.apc.com/shop/us/en/products/NetShelter-Zero-U-Mounting-Bracket/P-AR7711>. 2 pages.

Budind.com' [online]. "NEMA Enclosures (Waterproof Enclosures—Plastic and Fiberglass)," Retrieved from Dec. 13, 2010. Retrieved from the Internet: URL<https://web.archive.org/web/20101213215533/http://www.budind.com/sealed_plastic.php>. 3 pages.

Cablemarkers.com' [online]. "Building and Securing: Cable Tie Mounts," Retrieved from May 22, 2009. Retrieved from the Internet: URL<http://web.archive.org/web/20090522230125/http://www.cablemarkers.com/mounts.htm>. 8 pages.

Cableorganizer.com' [online]. "CableBox from BlueLounge Designs," Retrieved on Oct. 4, 2017. Retrieved from the Internet: URL<https://www.cableorganizer.com/blue-lounge-designs/cablebox/>. 5 pages.

Cableorganizer.com' [online]. "How to Install The Cable-Safe Cable Manager," Retrieved from Oct. 25, 2007. Retrieved from the Internet: URL<https://web.archive.org/web/20071025070312/http://images.cableorganizer.com/learning-center/how-to/how-to-install-cablesafe.pdf>. 2 pages.

Cableorganizer.com' [online]. "The Cable Catcher," Retrieved from Mar. 19, 2006. Retrieved from the Internet: URL<https://web.archive.org/web/20060319084842/https://www.cableorganizer.com/altinex-tabletop/altinex-cable-catcher.html>. 1 page.

Cordcaddy.com' [online]. "Cord Caddy: Uncluttering Patient Rooms since 1999," Retrieved on Oct. 4, 2017. Retrieved from the Internet: URL<http://cordcaddy.com/>. 3 pages.

Electriduct.com' [online]. "Electriduct Solid Wall Wire Duct," Retrieved from Aug. 18, 2011. Retrieved from the Internet: URL<https://web.archive.org/web/20110818095836/http://www.electriduct.com/Electriduct-Solid-Wall-Wire-Duct.html>. 3 pages.

Middleatlantic.com' [online]. "Search for: Cable Lacer," Retrieved on Oct. 4, 2017. Retrieved from the Internet: URL <https://www.middleatlantic.com/search.aspx?q=cable+lacer>. 7 pages.

Panduit.com' [online]. "MS14B," Retrieved on Oct. 9, 2017. Retrieved from the Internet: URL<http://www1.panduit.com/en/product/MS14B>. 1 page.

Panduit.com' [online]. "Physical Infrastructure Systems," Section H, pp. 285-288, Retrieved from the Internet: URL<https://stevenengineering.com/Tech_Support/PDFs/34_PHYSICAL-INFRASTRUCTURE.pdf>, 696 pages.

Panduit.com' [online]. "Wiring Duct & Duct Covers," Retrieved on Oct. 4, 2017. Retrieved from the Internet: URL<https://www.panduit.com/en/products/wire-routing-management-protection/wiring-duct-accessories/wiring-duct-duct-covers.html>. 25 pages.

Platt.com' [online]. "Back Panels for Enclosures," Retrieved on Oct. 4, 2017. Retrieved from the Internet: URL<https://www.platt.com/platt-electric-supply/Enclosure-Panels/Back-Panels-For-Enclosures/search.aspx?SectionID=2&GroupID=29&CatID=894&SubCatID=2276>. 3 pages.

Shop.quirky.com' [online]. "Plug Hub Cord Manager," Retrieved on Oct. 4, 2017. Retrieved from the Internet: URL<https://shop.quirky.com/collections/cord-cable-management/products/plug-hub>. 2 pages.

Wiremate.com' [online]. "Cable and Wire Management Solution Made Simple," Retrieved from Aug. 8, 2011. Retrieved from the Internet: URL<https://web.archive.org/web/20110808164148/http://wiremate.com:80/>. 8 pages.

* cited by examiner

COMPONENT MOUNTING DEVICES, SYSTEMS, AND METHODS

This Application is a continuation-in-part of U.S. patent application Ser. No. 13/897,299, filed on May 17, 2013, which claims priority to U.S. Provisional Patent Application Ser. No. 61/688,553, filed on May 17, 2012, and is a continuation-in-part of U.S. patent application Ser. No. 14/479,346, filed on Sep. 7, 2014, which claims priority to U.S. Provisional Patent Application Ser. No. 61/875,667, filed on Sep. 9, 2013, the disclosure of each which is hereby incorporated by reference herein in their entirety.

FIELD OF THE DISCLOSURE

This disclosure relates generally to mounting and, more particularly, to arrangements for mounting and organizing electronic devices, peripherals and associated cables of audiovisual, telecommunications, computer systems and the like.

BACKGROUND OF THE DISCLOSURE

Audiovisual, telecommunications, and computer systems, whether in home or office environments, are typically functional in nature. Yet, it is well known in the marketplace that the visual appearance and the amount of space these systems occupy in use can be as important to the consumer as the features they provide. Hence, most are designed for both functional and visual appeal.

As a practical reality, however, nearly all conventional audiovisual components, telecommunications equipment, computers and peripheral devices utilized include, or are used in combination with, a host of electronic devices such as external power supplies, modems, network routers, interfaces, and accessories which come in a wide variety of sizes, shapes and proportions relative to the components they support. Such systems usually also have a plurality of cords, wires, and/or cables including power cords to devices, audio and video signal wires, and network cables. Notwithstanding their necessity, as the lengths provided are intended to accommodate a broad range of consumers, they are often unnecessarily long. The result is bunched, tangled, unsightly piles of excess power cords, cables, etc. emanating from and about the visually appealing and space saving devices they are intended to power. Adding to the chaos is the host of external power supplies, modems, network routers, interfaces, power outlet strips, and like accessories that typically surround, and are required for operation of, audiovisual components, telecommunications equipment, computers and their peripherals.

Conventional arrangements that have been proposed for addressing these problems have ranged from metallic organizing and storage boxes to do-it-yourself bundling of wires and other attempts to hide the inevitable unsightly appearance that results. One approach has been to install such audiovisual components, telecommunications equipment, computers and peripheral devices in equipment storage rack systems, using wire ties or ratcheting nylon straps to cinch bundles of excess cable and secure the devices within the rack. These systems commonly include tie bars, looms, or panels that provide attachment points for wire ties, or troughs for management of excess cable. Where a relatively small number of peripheral devices and cables are used, without a storage rack system, or where cable runs terminate, an electrical box is often utilized to house the equipment or retain the ends of the cables. Such boxes are typically constructed of metal and adapted for mounting on the wall, floor or for portable use. Alternatively, plastic boxes are utilized for local mounting and usually include features for securing a specific device or managing a particular type of cable. Whether constructed of metal or plastic, the boxes contain a back plate that serves as a mounting panel, as well as looms, attachment points for wire ties, and threaded holes.

In some cases, integral structures are provided for a coil of excess cable, connector blocks, and panel mounted connectors, collectively, for securing equipment and managing cable. Panel mounted connectors allow incoming cords to plug in, such as by a latching action or by screwing onto the connector shell to secure the cable. Panel mounted connectors are mounted on an internal panel or on the exterior surface of the box. Still other arrangements include cable management boxes for holding an electrical power outlet strip and excess cable, such as where computers and multimedia peripherals are installed. Cable management boxes or troughs may be integral with office type furniture.

While these arrangements have been found useful, their characteristic one size fits all or fixed size approach and non-adaptability to customization do not resolve the inherent disorganization and unsightly appearance they were intended to alleviate. Indeed, even in cases where the variety or quantity of devices and cables are not accommodated by the specific integral structures or by the interior dimensions of the box.

Cable management boxes of metal construction typically include a panel intended to be customized to provide mounting points to secure devices. While serviceable, customization of metal not only requires machining, but also significant planning and effort. Moreover, once installed, additional machining is often needed to change and/or add mounting point locations, compounding the difficulty of their use. All items to be mounted must fit within the confines of the restrictive structure of the box. These boxes have been found particularly problematic if wireless devices must be accommodated since their metal construction interferes with radio transmissions. When the boxes are closed, the result is inadequate ventilation of electronic peripherals, prolonged stress on the devices and cables themselves, and ultimately equipment failure or safety hazards. Conventional arrangements have also been found complicated, heavy, costly, and burdensome in requiring substantial time, labor and planning by the user for their implementation, while neither fully eliminating visual chaos nor facilitating access or use of the devices and cables.

SUMMARY OF ILLUSTRATIVE EMBODIMENTS

Accordingly, it is an object of the disclosure to provide, in some embodiments, a device and cable management apparatus, system and method that is economical, durable and simple to use. Another object of the disclosure is to provide, in some embodiments, a peripheral mounting panel and cable management apparatus, system and method that minimizes time, labor and burden involved in organizing and managing storage of peripheral devices, cables and the like. A further object of the disclosure is to provide, in some embodiments, a device and cable management apparatus, system and method that not only allows customization and organization by the user of peripheral devices, but also adequate ventilation of electronic peripherals.

Yet another object of the disclosure is to provide, in some embodiments, a device and cable management apparatus, system and method that provides adequate ventilation while eliminating stress on the electronic peripheral devices during use, and associated equipment failure and safety hazards. Still another object of the disclosure is to provide, in some embodiments, a device and cable management apparatus, system and method that eliminates the visual and organizational chaos often associated with audiovisual, telecommunications, computer devices and their peripherals during use.

Another object of the disclosure is to provide, in some embodiments, a peripheral mounting panel and cable management apparatus, system and method that allows an installer of audiovisual or electronic systems to simply and easily position a tie fastener, where and as desired, for optimal and orderly securement of electronic devices and cables.

A further object of the disclosure is to provide, in some embodiments, a peripheral mounting panel and cable management apparatus, system and method that allows a user to readily form perforations in the panel so as to allow passage of ties therethrough and around a peripheral device to be secured, thereby clinching the device to the panel.

Yet a further object of the disclosure is to provide, in some embodiments, a peripheral mounting panel and cable management apparatus, system and method that allows excess cable, power strips, cable connectors, and electronic devices to be easily and economically secured to the panel.

Still a further object of the disclosure is to provide, in some embodiments, for mounting of peripheral devices without requiring a box-like structure of a fixed predetermined size for the same.

According to one aspect of the disclosure, a customizable device and cable management apparatus is provided, which comprises a panel of relatively pliable, crack resistant, polymeric material for mounting one or more electronic devices and for retaining and managing cable emanating therefrom.

Implementations can include any, all, or none of the following features. The panel has a first face and a second, opposing face, the second face being generally parallel to the first, each panel face including a plurality of side edges coextensive and in cooperation with those of the other face, the side edges being joined to one another end to end and also coextensively with one another so as to define the exterior of a geometric shape comprising the panel. The panel also includes spacer members adjacent to at least one pair of opposing second side edges for supporting and suspending the panel a selected distance from a support surface on which it rests or to which it is mounted for passage of suitable tie fasteners for securing the one or more devices and cables to the panel. User selected first perforations in the panel arranged in a shape complementary to the peripheral device to be mounted are arranged and configured to suitably receive and pass through suitable tie fasteners to manage and secure cables emanating from the device. User selected second perforations in the panel allow mounting the same to the selected mounting surface, the perforations being arranged in a shape complementary to the surface to which the panel is to be mounted and being arranged and configured to suitably receive and pass through selected fasteners for securing the same to the support surface.

By another example, a unitary customizable device and cable management apparatus is provided in some exemplary embodiments. The apparatus includes a panel of relatively pliable, crack resistant, polymeric material for mounting one or more electronic devices and for retaining and managing cable emanating therefrom, the panel having a first face and a second, opposing face, the second face being generally parallel to the first, each panel face including a plurality of side edges coextensive and in cooperation with those of the other face, the side edges being joined to one another end to end and also coextensively with one another so as to define the exterior of a geometric shape comprising the panel.

Implementations can include any, all, or none of the following features. The panel further includes support members adjacent to at least one pair of opposing second side edges for supporting and suspending the panel a selected distance from a support surface on which it rests or to which it is mounted. Tie fasteners are provided for securing the one or more devices and cables to the panel. First user selected perforations formed in the panel are arranged in a shape complementary to the peripheral device to be mounted and are arranged and configured to suitably receive and pass through the fasteners to manage and secure the one or more devices and cables to the panel. In addition, second user selected perforations formed in the panel enable mounting the same to the selected mounting surface. The perforations are arranged in a shape complementary to the surface to which the panel is to be mounted, and are arranged and configured to suitably receive and pass through suitable fasteners for securing the same to the support surface. Also provided is a cover of a material having characteristics of that of the panel and detachably secured to the panel for managing and hiding from view the device mounted to the panel, selected fasteners being mounted in proximity to the panel for holding the cover in place, whereupon engagement of the cover with the panel, the unitary device and cable management apparatus is assembled.

According to a further exemplary arrangement, a method is provided for customized management of devices of audiovisual, telecommunications and computer systems, and cables emanating therefrom. Initially, the user selects a panel of relatively pliable, crack resistant, polymeric material for mounting one or more electronic devices and for retaining and managing cables emanating therefrom. The panel has a first face and a second, opposing face, the second face being generally parallel to the first, each panel face including a plurality of side edges coextensive and in cooperation with those of the other face, the side edges being joined to one another end to end and also coextensively with one another so as to define the exterior of a geometric shape comprising the panel. The panel further includes support members adjacent to at least one pair of opposing second side edges for supporting and suspending the panel a selected distance from a support surface on which it rests or to which it is mounted. Next, the user forms first selected perforations in the panel, the perforations being arranged in a shape complementary to the peripheral device to be mounted, and being arranged and configured to suitably receive and pass through tie fasteners for managing and securing the one or more devices and cables to the panel. Thereafter and optionally, the user forms second selected perforations in the panel for mounting the same to the selected mounting surface. The user selected formations are arranged in a shape complementary to the surface to which the panel is to be mounted, and are arranged and configured to suitably receive and pass through selected fasteners for securing the same to the support surface.

DETAILED DESCRIPTION OF ILLUSTRATIVE EMBODIMENTS

Figure 1:
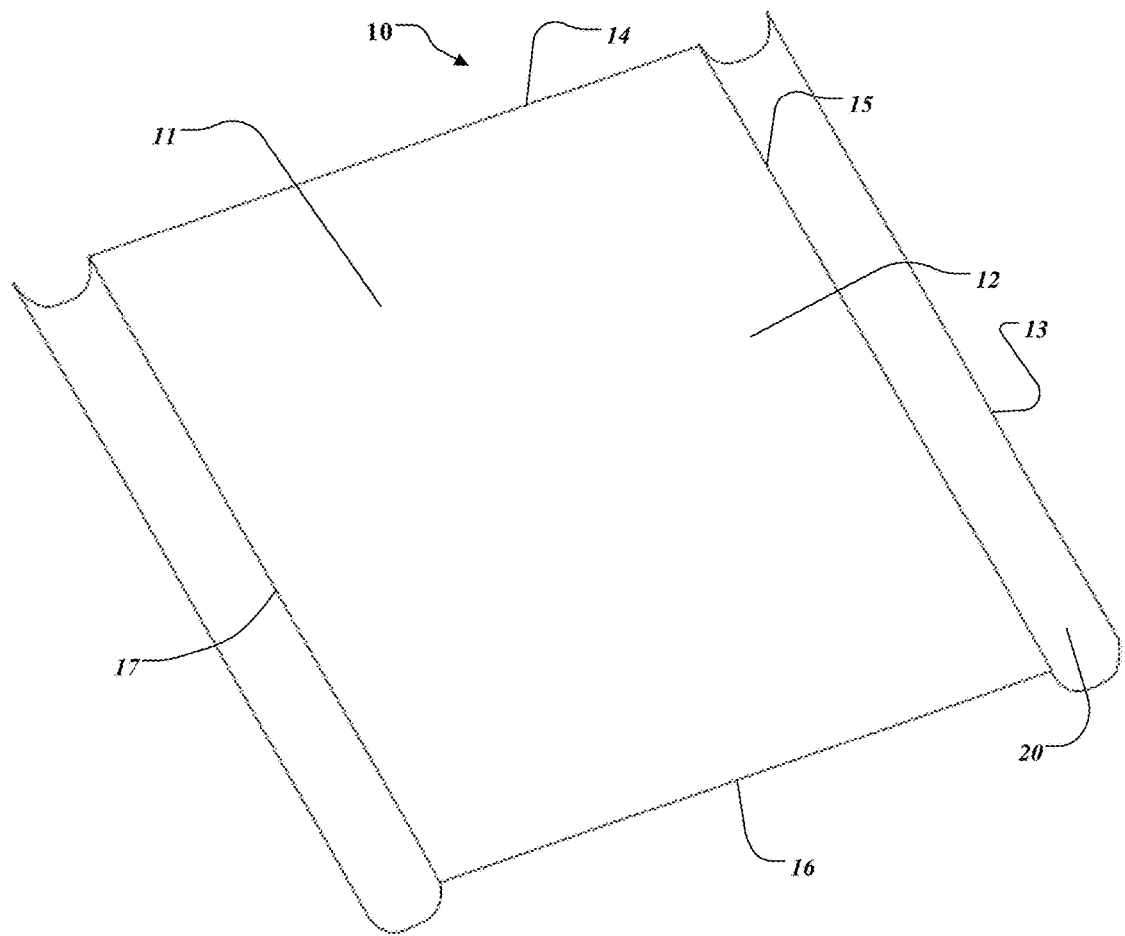
FIG. 1 is a perspective view of a mounting panel in accordance with one aspect of the disclosure.
Figure 2:
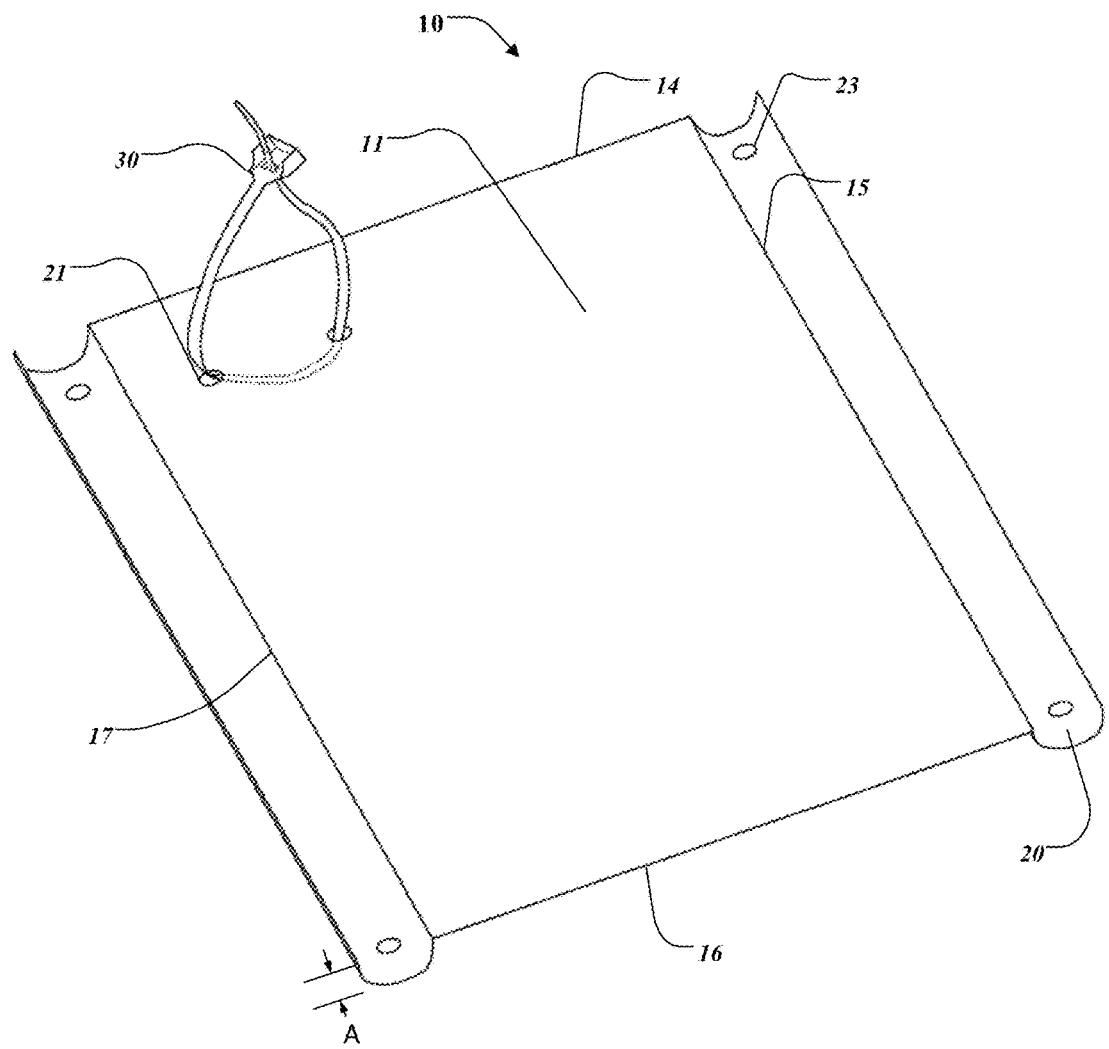
FIG. 2 shows the panel of FIG. 1 with a tie for mounting an electronic peripheral device, according to one aspect of the disclosure.
Figure 3:
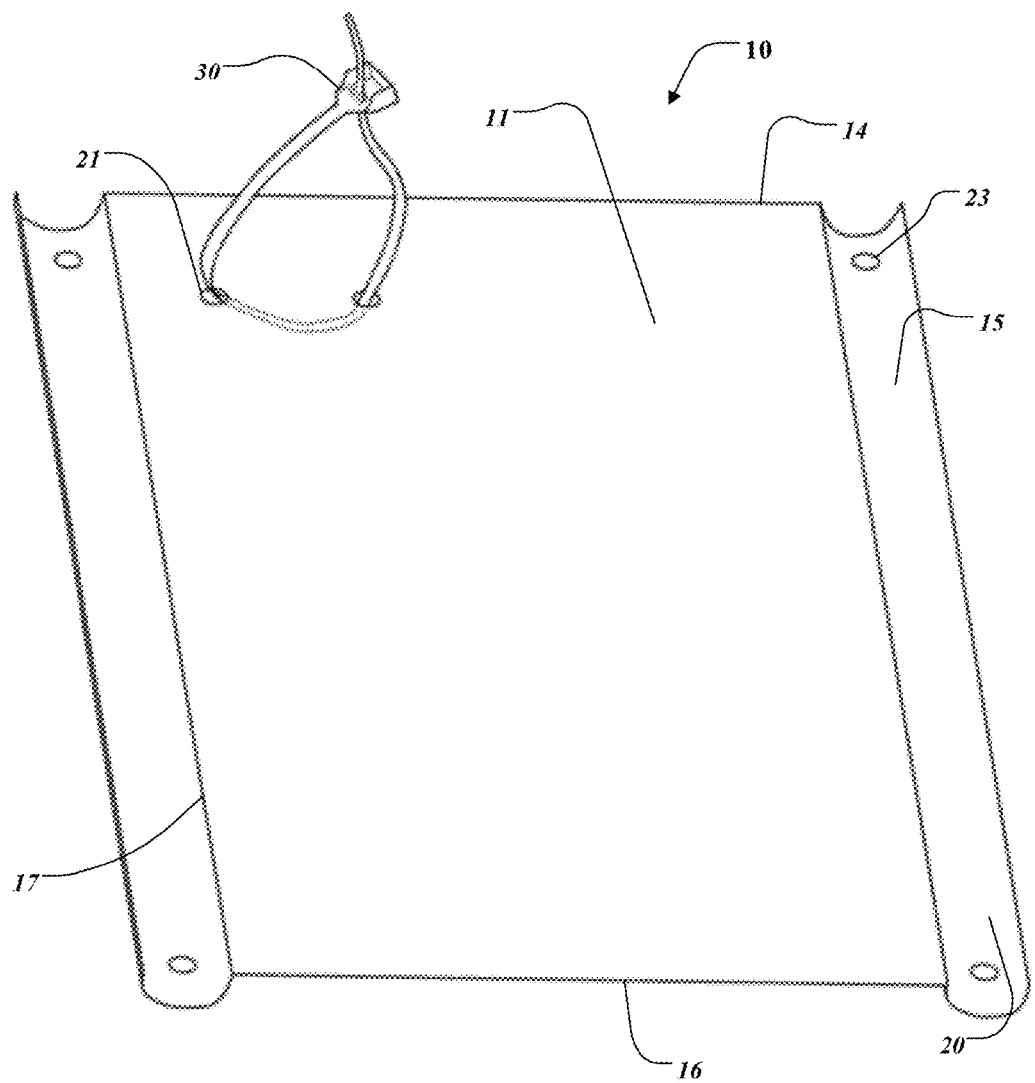
FIG. 3 is a forward perspective view of the panel of FIG. 1 with a tie for mounting an electronic peripheral device, according to another aspect of the disclosure.
Figure 4:
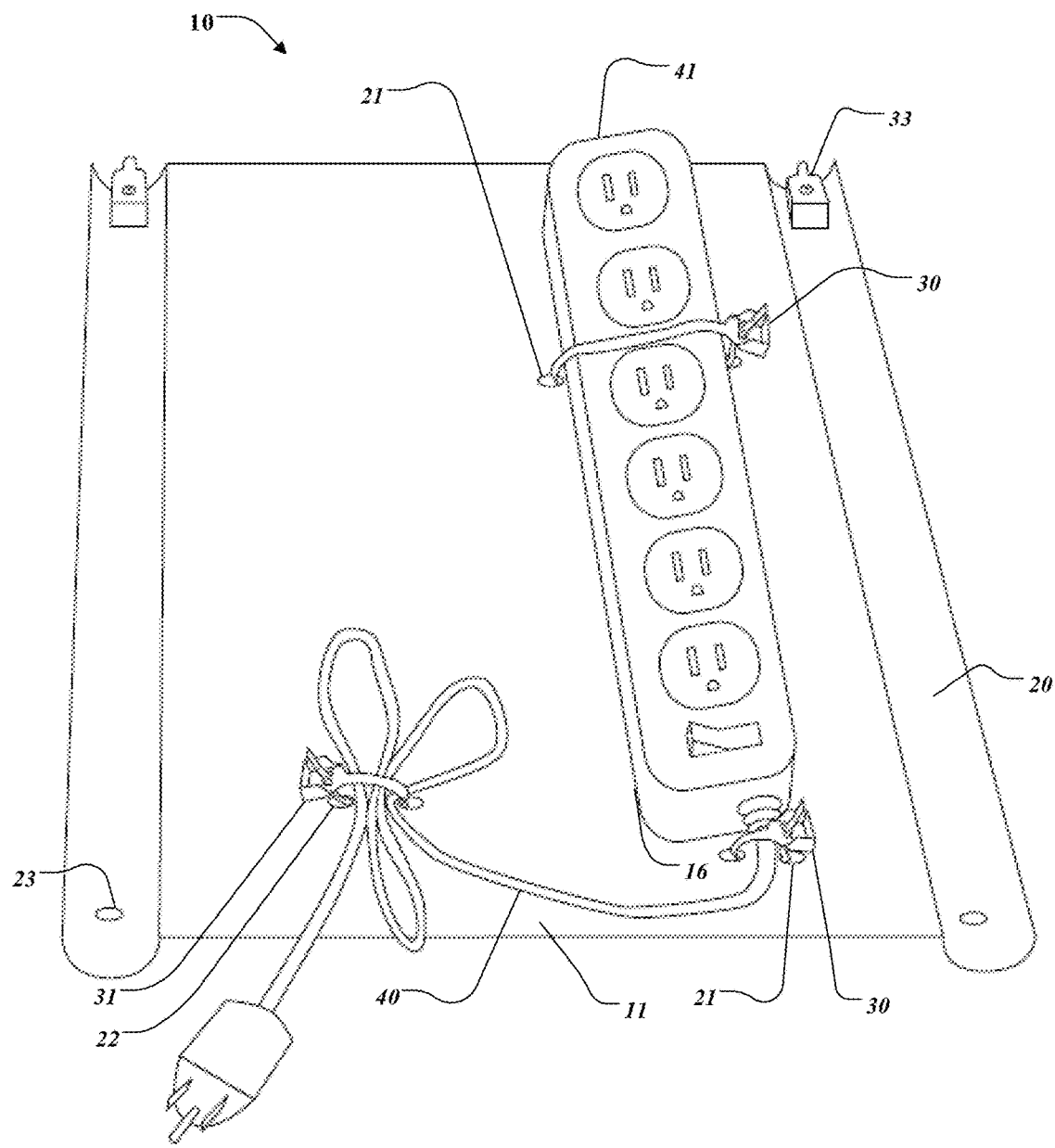
FIG. 4 illustrates the panel of FIG. 1 mounting an electronic peripheral device and attachment accessory, according to one aspect of the disclosure.
Figure 5:
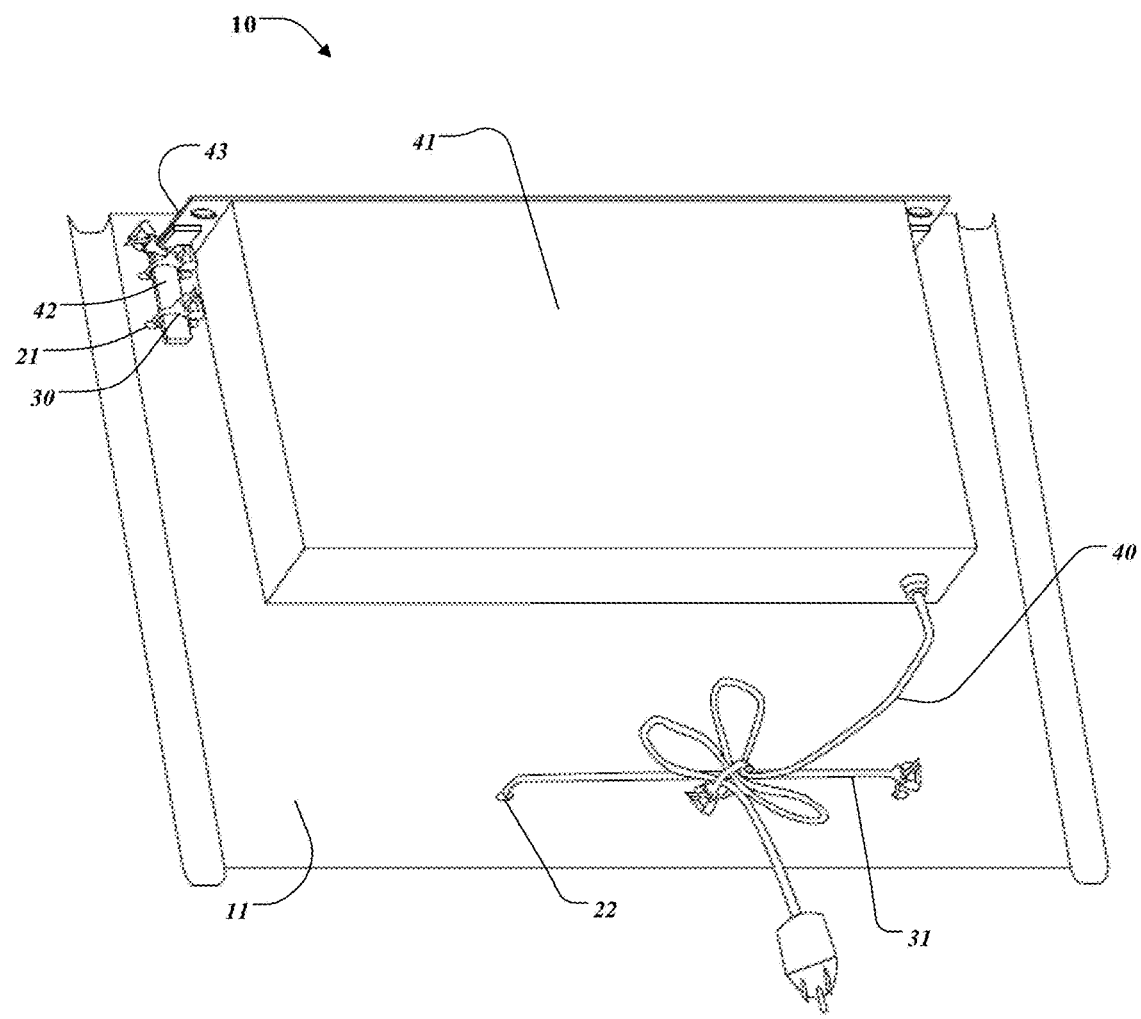
FIG. 5 shows the panel set forth in FIG. 1 with an alternative electronic peripheral device and mounting hardware accessory attached.
Figure 6:
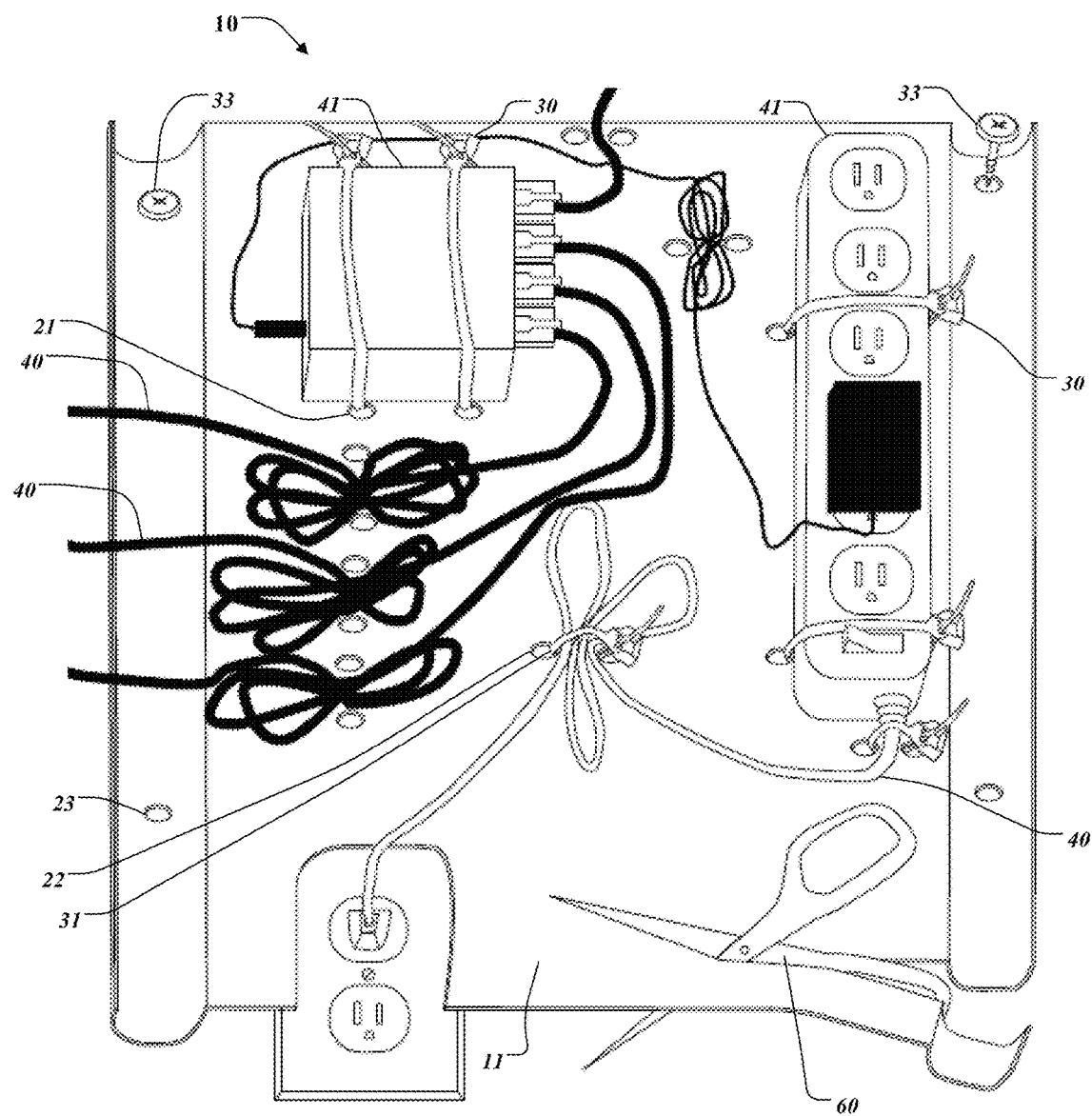
FIG. 6 shows the panel set forth in FIG. 1 mounting a plurality of electronic devices and accessories, according to an exemplary arrangement of the disclosure.
Figure 7:
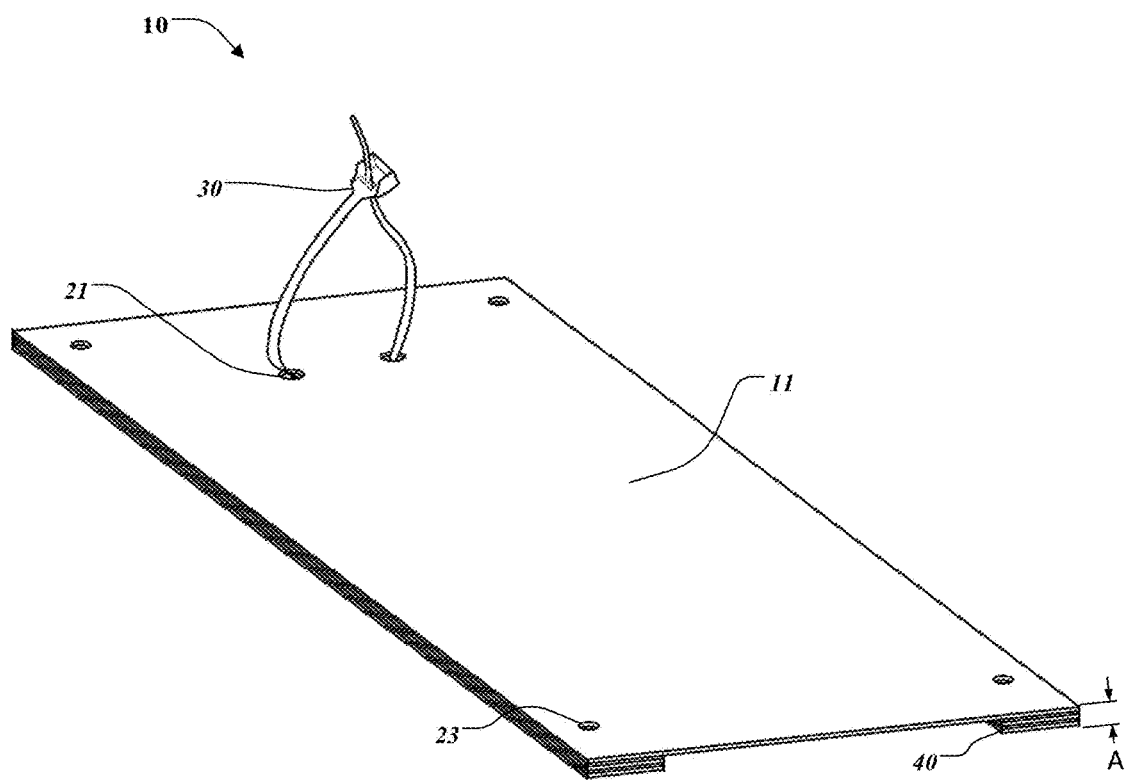
FIG. 7 is a perspective view of a mounting panel according to a further instance of the disclosure, such providing a modified construction for achieving the same functionality as the arrangement shown in FIGS. 1-6 above.

Referring now to the drawings and, more particularly, to FIGS. 1-6, there is shown generally a customizable device and cable management apparatus 10, system and method according to various aspects of this disclosure. In one example, a mounting panel 11 is provided which comprises a sheet of pliable or easily worked material having a first face 12 and a second, opposing face 13, the second face being generally parallel to the first. Each panel face includes a plurality of side edges coextensive and in cooperation with those of the other face; more specifically, a first side edge 14, second side edge 15, third side edge 16 and fourth side edge 17.

The side edges are joined to one another end to end and also coextensively with one another so as to define the exterior of a geometric shape comprising the panel, e.g., a square, rectangle, circle, oval or a complex custom geometric configuration.

According to one embodiment, such as in the case of a panel 10 formed in the shape of a square or rectangle, the first and third side edges 14, 16, and the second and fourth side edges 15, 17, respectively, are generally parallel to one another. In turn, the first 14 and second 15, second 15 and third 16, third 16 and fourth 17, and fourth 17 and first 14 side edges are thus oriented generally perpendicularly to one another.

The mounting panel so formed preferably includes edges or contours 20 for supporting and suspending the panel a selected distance (A) (FIG. 2) from a support surface on which it rests or to which it is mounted. For example, cable management apparatus 10 may be constructed such that the edges or contours define channels 20 extending along opposing sides of the cable management apparatus. In an exemplary embodiment, channels 20 extend along second and fourth sides 15, 17, and may extend entirely along second and fourth sides 15, 17 (e.g. extending entirely along second and fourth sides 15, 17 between first and third sides 14, 16).

Channels 20 may have a cross-sectional shape that allows mounting panel 10 to be supported or fastened to a surface while first and second major faces 12, 13 are spaced from the surface. For example, in the exemplary embodiment shown in FIG. 1, channels 20 have a substantially arcuate cross-sectional shape, and channels 20 curve a distance below first and second major faces 12, 13. Alternatively or in addition, channels 20 may have semi-circular, square, rectangular, arcuate or other cross-sectional shapes. When mounting panel 10 is positioned with second major face towards the surface, and at least partially supported by the surface via channels 20, first and second major faces are spaced from the surface by the channels 20.

Channels 20 have a height such that the first major face 12 is spaced approximately distance (A) from the surface. Such a dimension of channels 20 may be configured to provide adequate spacing between a surface and major face 13 to accommodate fasteners or connectors, for example, that may extend through panel 10 for mounting of one or more electrical components, attachment of a cover, and/or other items. Alternatively or in addition, distance (A) may be selected to allow passage of airflow ventilation and/or to provide convective heat transfer away from one or more components that may be attached to, or concealed by, panel 11. In various exemplary embodiments, distance (A) may be between about 1/16 inch and 2 inches, 1/8 inch and 1/2 inch, or about 1/4 inch.

Although distance (A) between the panel 10 and the mounting surface is preferably about 1/4 inch, in some exemplary embodiments, any distance is considered adequate, even zero distance, particularly if mounted to a surface or superstructure whose shape afforded the requisite space on the back side or opposing face 13 of panel 11 for passage of ties 30 (for instance, a wire tie, cable tie, zip tie, tie wrap or the like) and/or cable therethrough. The contours 20 are preferably formed integrally with, or may be mounted to, opposing second side edge 15 and fourth side edge 17 or, in the alternative, to opposing first 14 and second side edges 16. In an exemplary embodiment, mounting panel 10 is formed as a unitary component. First and second faces 12, 13 and channels 20 are integrally formed as a unitary component.

In some exemplary embodiments, panel 10 consists of only first and second faces 12, 13, and channels 20 extending along the entire length of panel 10 between opposite first and third edges 14, 16. Channels 20 may form outermost portions of panel 10 along opposite sides, and edges 14, 16 may form outermost portions of panel 10 at opposite ends. In such embodiments, panel 10 may be free of any openings through panel 10, connectors, or other features formed in panel 10. Such a panel 10 may be readily customized by a user for a particular application, while reducing the additional features or openings defined during initial manufacturing of panel 10 that could interfere with a particular mounting arrangement or application. Further, an exemplary panel 10 consisting only of first and second faces 12, 13 and channels 20 extending along the entire length of panel 10 also facilitates efficient and economical manufacture of panel 10.

In some exemplary embodiments, panel 10 may have a pattern of holes 21, 23 spaced along channels 20 and/or on through first and second faces 12, 13. Holes 23 may be added by a user during customization of panel 10, as described further herein, and/or may be defined through panel 10 during initial manufacture of panel 10.

Exemplary mounting surfaces that may support panel 10 include, but are not limited to, walls, e.g., using conventional double-stick tape, floors, e.g., including resting on the floor without mounting, and ceiling surfaces, desk side panels or under surface panels, book shelves, kiosks, computer tower side panels, and the like. According to one arrangement, a user custom forms first holes 21 (FIG. 2) in the panel 10, e.g., such as by conventional drilling at a user determined location, or poking through a pre-formed, stenciled or perforated hole, array of holes, or the like, as desired, to suitably pass a tie 30, e.g., wire, textile, a polymeric strand or tubing, through the panel either to manage and secure computer cables 40 or the like thereto, or to secure a peripheral device 41, or to secure a hardware accessory 42 for mounting devices 43, or for providing attachment points 22 for additional ties 31.

Alternatively or concurrently, as shown in FIGS. 2-4, 6 and 7, for example, the user may optionally custom form second holes 23 in panel 11 for mounting the same to the selected mounting surface. The second holes 23 are desirably similar to those of the first, being formed, e.g., by conventional drilling, or by poking through a pre-formed, stenciled or perforated hole, array of holes, or the like, as desired, for suitably passing a selected fastener 32, e.g., a conventional or custom designed screw, bolt, rivet, picture hanger, or the like constructed of metal or a polymeric material, through the panel for securing the same to the support surface.

Figure 8:
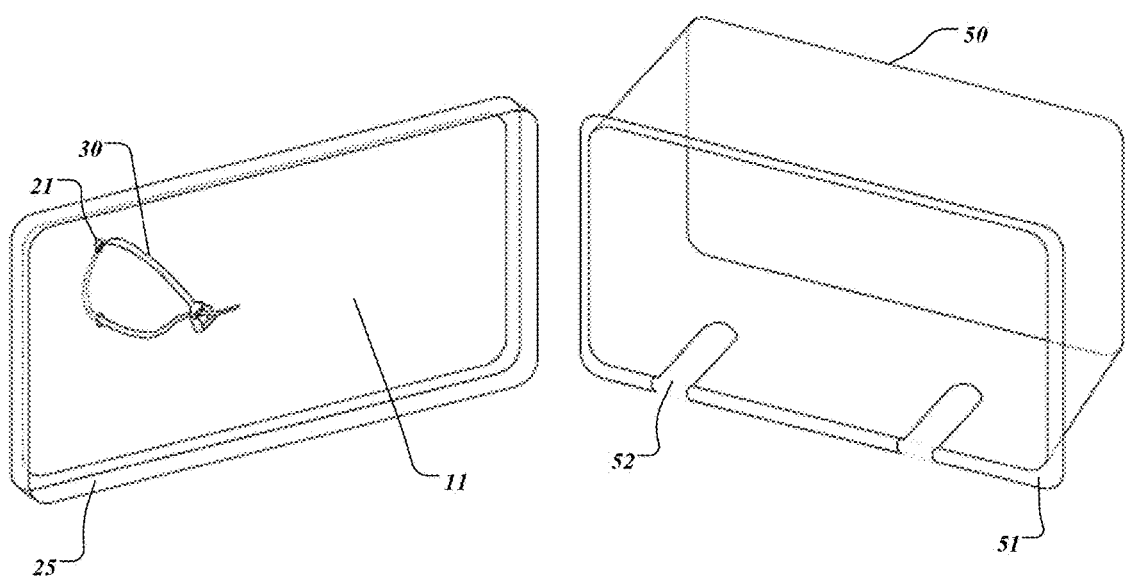
FIG. 8 is a perspective view of a mounting panel in accordance with a still another aspect of the disclosure, having a detachable cover.

As illustrated in FIG. 8, a cover 50, e.g., a box like structure, formed, for instance, of the same material as the panel 10, is also provided for managing and hiding from view the devices 40-43 mounted to the panel. Suitable fasteners 33 are mounted on, or in proximity to, the panel for holding the cover in place.

Alternatively or concurrently, the panel mates with or is otherwise secured to the cover so as to allow the resulting panel-cover structure to be moved, relocated or repositioned as a single unit. Optionally, the panel has molded ridges 25 along its respective side edges for snap attachment to corresponding edges 51 of the cover, e.g., akin to the manner of attachment of a plastic storage container with a plastic snap-on lid. As another option, other integral or add-on features, e.g., binding devices, bolts, clamps, latches or the like, are included with the panel for securing the cover thereto. Preferably, the cover is notched or otherwise ventilated, as desired, to prevent heat buildup from the electronic devices and growth of bacteria inside the panel-cover unit. Custom notching of the cover by the user for ventilation, according to the method described above, is deemed to be within the spirit and scope of this disclosure.

According to a further example, a support structure 24, e.g., spacers, feet, pads, protrusions or the like, is provided at each end or corner of the mounting panel for supporting or suspending the panel the selected distance (A) above or from the support surface. An arrangement of this general description may be found, for instance, in FIG. 7. Support structures 24 may be integrally formed with first and second major faces 12, 13, of panel 10 such that support structures 24 and first and second major faces 12, 13 form a unitary panel 10. In an exemplary embodiment, support structures 24 extending continuously along an entire length of panel 10 on two opposite sides of panel 10. Alternatively or in addition, panel 10 may include one or more support structures 24 positioned intermittently along a length of panel 10, for example along two opposite sides.

Generally speaking, mounting panel 10 may be suitably sized and shaped to accommodate the desired application. For example, the panel 10 may be relatively long for accommodating electronic equipment and cable systems, ranging from less than 12 inches to many feet in length, to being relatively short for simple or user specific applications, e.g., 4-8 inches. According to one arrangement, the width between contours 20 or spacers 24 is generally within a range about of about 4 inches and about 22 inches.

In various exemplary embodiments, panel 10 may incorporate one or more integral mating features cooperative with one or more corresponding features of a cover or other component. For example, in another alternative embodiment, illustrated generally in FIG. 8, the side edges of panel 10 are provided with mating contours 25 preferably formed integrally with, or are mounted to, the panel for mating engagement with correspondingly and cooperatively shaped mating contours 51 on cover 50. Upon placing the cover 50 on the panel 10, and engaging the corresponding and cooperatively shaped mating contours 51, with or without fasteners 33, an integral, closed panel—cover unit is formed over the panel. Optionally, notches 52 are formed in the cover 50 for allowing passage of cables therethrough. Custom notching of the cover 50 by the user for passage of cables, according to the method described above, is also deemed to be within the spirit and scope of this disclosure.

It is preferred that panel 10 be constructed of a polymeric material such as a conventional or custom formulated plastic which is soft and impact resistant so that it may be easily drilled, cut, notched or hole punched for ready customization by a user, with hand tools such as scissors, a utility knife or a hot soldering iron, without cracking of adjacent surfaces. Suitable polymeric materials include, but are not limited to, low density polyethylene or polypropylene with added elastomers. In an exemplary embodiment, panel 10 is made from a polyvinyl chloride material, and may be polyvinyl chloride extruded to be relatively thin.

Although the device mounting panel and cable management apparatus, system and method has been shown and described in connection with selected materials, panel shapes and design configurations, those skilled in the art will appreciate that other materials, geometries and arrangements may be utilized, given consideration to the purpose for which the device, apparatus, system and method are intended. For instance, in various exemplary embodiments, the panel 11 may be constructed of any material that provides the desired rigidity and can be modified with simple, conventional hand tools 60 (See, FIG. 8 as an example), within the spirit and scope of this disclosure. Notably, polymeric formulations, thicknesses, or surface treatments can be varied to achieve desired results, including, but not limited to, material opacity, color, strength, workability, fire resistance, and/or radio frequency blockage.

Alternatively or concurrently, the device mounting panel and cable management apparatus, system and method may be used as a back plate within a traditional electrical box or otherwise incorporated therewith, advantageously providing, for instance, a polymeric mounting plate that is more easily customized than are traditional metal back plates.

Further in the alternative or concurrently therewith, rather than install a panel mount connector into a traditional connection panel, a cord is mounted which provides a cable end connector. An arrangement of this general description has been found to provide added savings in labor and reduced burden to the user.

According to a further example, a variety of clips, hooks, snaps, fasteners, and/or other hardware are provided with or on the panel for securing accessories, peripherals or other devices, or for positioning the cover or lid on the panel. The cover, like the panel, is desirably constructed of a conventional or custom formulated, crack resistant polymeric material suitable for cutting or notching with hand tools such as scissors, a utility knife or a hot soldering iron for ready customization by the user. Optionally, the user may cut or notch the cover, as desired, in order to allow it to be fit over cables or to provide ventilation. Polymeric materials of construction have been found particularly beneficial for their characteristics of not inhibiting wireless network or other radio frequency transmissions.

According to yet a further arrangement, alternatively or concurrently therewith, the cover material is a selected transparent or translucent plastic that is, in any event, clear enough to permit visual inspection of the peripheral devices mounted therein. A clear polymeric material, for instance, provides the added benefit of allowing penetration of infrared control signals that may be needed for their operation or interaction with the audiovisual, telecommunications, computer or like equipment with which they are being used.

As still another example, the panel is a flat planar structure without supporting opposing edges for use where the panel of this disclosure is to be mounted to a structure and the structure supports the panel such that there is free space behind the panel to pass tie fasteners or cables, for instance, when used in an equipment rack.

Turning now to another aspect of the disclosure, there is provided a method by which the user customizes and installs the panel by making perforations in the same through which the user inserts a tie to pass around the underside of the panel and return to the top side of the panel, so as to secure cables and electronic devices to the panel. Beneficially, further user customization of the panel is facilitated for enabling wall mounting of the panel, addition of a cover, or affixing of other hardware.

More specifically, a method is provided for mounting one or more devices of audiovisual, telecommunications and computer systems to a panel, accessories and for securing and managing cables emanating therefrom. Initially, the user selects a panel, such as panel 10, of relatively pliable, crack resistant, polymeric material for mounting the one or more electronic devices and retaining and managing the cables emanating therefrom. The panel 10 has a first face and a second, opposing face, the second face being generally parallel to the first, each panel face including a plurality of side edges coextensive and in cooperation with those of the other face, the side edges being joined to one another end to end and also coextensively with one another so as to define the exterior of a geometric shape comprising the panel, as shown in FIG. 1, for example. The panel further includes support members adjacent to at least one pair of opposing second side edges for supporting and suspending the panel a selected distance from a support surface on which it rests or to which it is mounted.

Next, the user custom forms first selected perforations 21 (FIG. 2) in the panel 10, the perforations being arranged in a shape complementary to the peripheral device to be mounted and arranged and configured to suitably receive and pass through tie fasteners for securing the one or more devices and accessories to the panel, and for securing and managing the cables.

Thereafter, and optionally, the user custom forms second selected perforations in the panel for mounting the same to the selected mounting surface. The perforations are arranged in a shape complementary to the surface to which the panel is to be mounted and are arranged and configured to suitably receive and pass through first selected fasteners for securing the same to the support surface.

Last, and optionally, the user selects a cover of a material having characteristics similar to those of the panel, e.g., the same or different plastic than that of the panel, for managing and hiding from view the device mounted to the panel, second selected fasteners being mounted in proximity to the panel for holding the cover in place.

Figure 9:
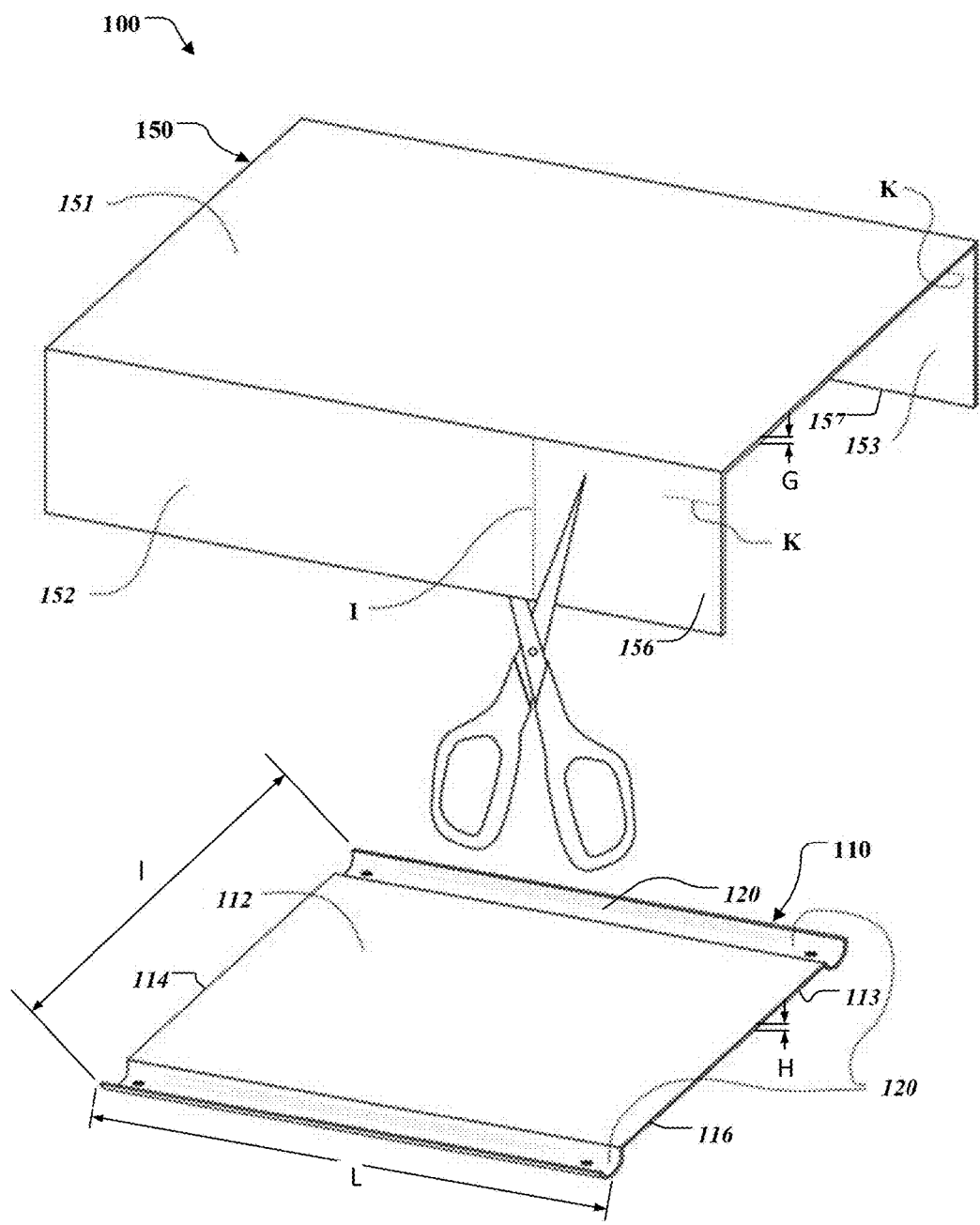
FIG. 9 is an exploded perspective view of an exemplary cover and mounting panel.

Referring to FIG. 9, an exemplary mounting system 100 may include a mounting panel 110, and a cover 150. Mounting panel 110 includes first and second opposite major faces 112, 113 and channels 120 extending along a length (L) of mounting panel 110, and in some embodiments may have features similar to panel 10. Cover 150 may be positioned to at least partially surround mounting panel 110 and provide an internal volume that may contain wires, power strips, communication equipment, and/or other components.

First and second opposite major faces 112, 113 of mounting panel 110 may be planar faces separated by a substantially uniform panel thickness (H). Panel thickness (H) may be selected such that mounting panel 110 is substantially shape stable and/or can support one or more components mounted to mounting panel 110, while allowing modification by a user (e.g. such that mounting panel 110 can be readily cut without requiring specialized equipment).

First and second opposite major faces 112, 113 define continuous flat surfaces that may be free of openings or protrusions between channels 120. In an exemplary embodiment, first and second major faces 112, 113 are solid at each location between ends 114 and 116, such that no openings are defined through the first and second major faces 112, 113. As described in greater detail herein, first and second major faces 112, 113 that are free from pre-existing openings (e.g. free from holes created during initial manufacturing of mounting panel 11) may facilitate customization by a user as desired for a particular application without limitation of pre-existing openings. In other exemplary embodiments, mounting panel 110 may include one or more holes, perforations, score marks, and/or guidelines that may be used or facilitate further modification by a user for a particular application.

Figure 12:
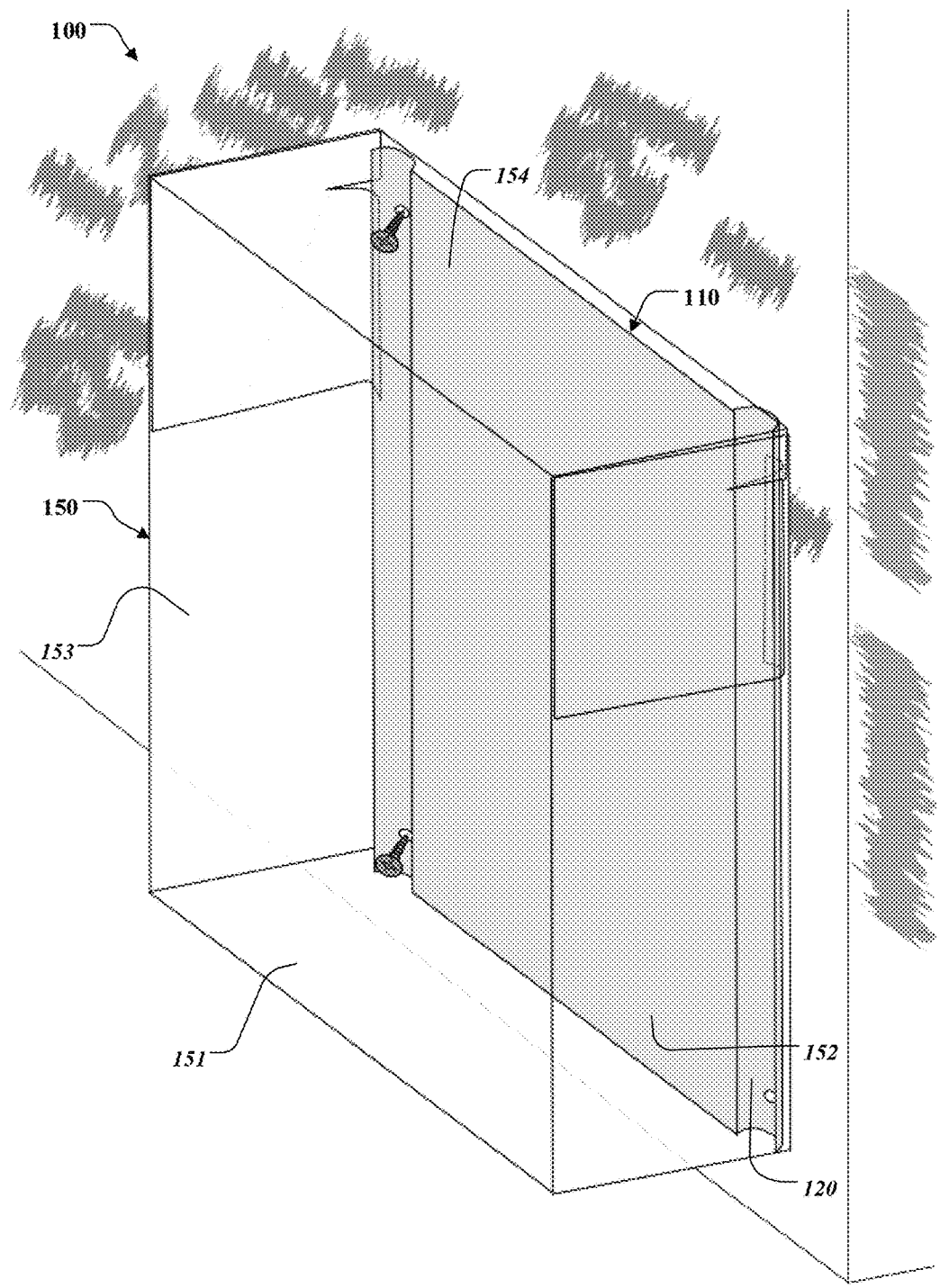
FIG. 12 is a perspective view of the exemplary cover in a folded configuration covering the mounting panel of FIG. 9.
Figure 13:
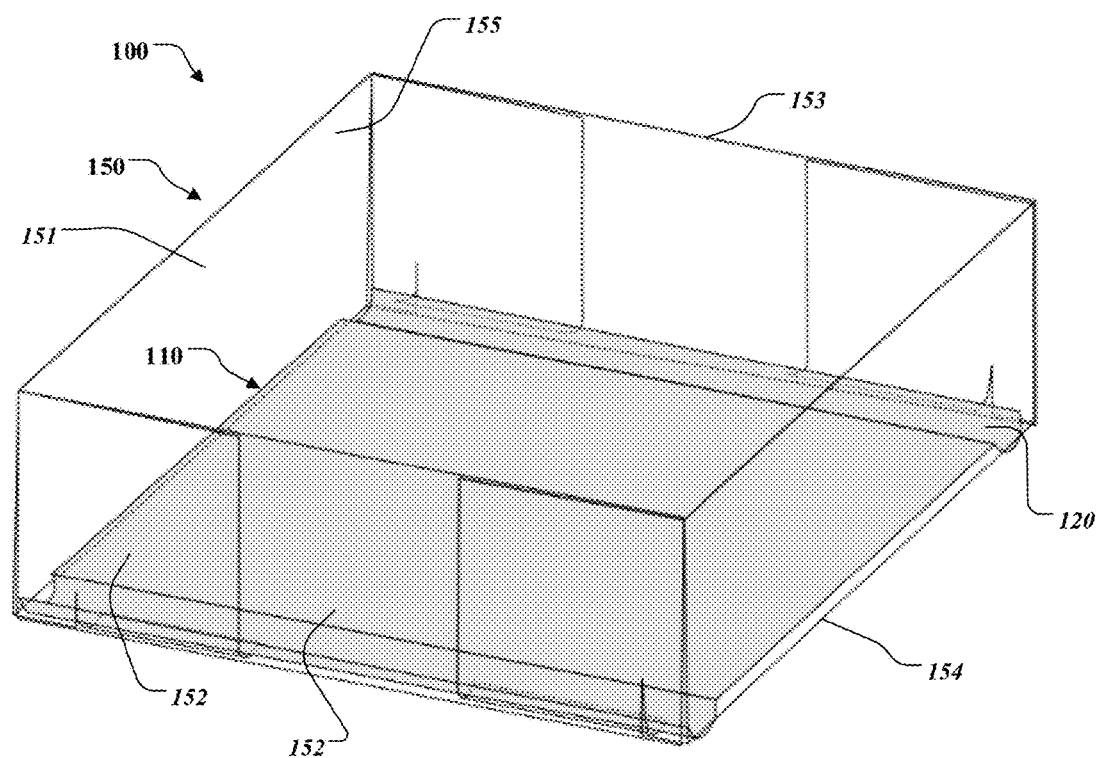
FIG. 13 is a perspective view of the exemplary cover in a folded configuration covering the mounting panel of FIG. 9.

Mounting system 100 may include a cover 150 configured to at least partially surround mounting panel 110. In an exemplary embodiment, cover 150 may be constructed to have the shape of a three-sided box, and include a first side 151, and second and third sides 152, 153. Cover 150 may define a substantially rectangular volume between first, second and third sides 151, 152, 153 that can at least partially accommodate mounting panel 110 and/or one or more electrical or other components. In some exemplary embodiments, cover 150 may further include fourth side 154 (FIG. 12) and/or fifth side 155 (FIG. 13).

A cover 150 defining a three-sided box may be used as a wire raceway in which wires are secured to mounting panel 110 and concealed by cover 150. Mounting system 100 may accommodate a desired length of raceway by cutting mounting panel 110 and cover 150 for shorter lengths, or arranging multiple panels 110 and covers 150 end to end for longer lengths. An exemplary mounting panel 110 and cover 150 having substantially flat ends free of connecting features or other protrusions facilitates desired positioning while reducing the required modification. For example, ends of first and second panels 110 and cover 150 may be positioned next to each other to provide a streamlined aesthetic appearance, and in an exemplary embodiment, a cut end of a first panel 110 and/or cover 150 may be readily positioned next to a second panel 110 and/or cover 150 having uncut ends (e.g. unmodified by an end user at the installation location).

Edges 156, 157 of second and third sides 152, 153 may be spaced to accommodate mounting panel 110 such that cover 150 may be positioned at least partially around outermost edges of mounting panel 110. For example, cover 150 may have a width (C) (FIG. 18) between edges 156 and 157 that is larger than a width (F) between outermost edges 121, 122 of panel 110 (e.g. outermost edges of channels 120). In various exemplary embodiments, width (C) is similar to width (F), and cover 150 may be positioned over mounting panel 110 such that edges 156, 157 are flush with a surface behind mounting panel 110. For example, width (C) may be between 0.8*(F) and 1.2*(F), 0.9*(F) and 1.1*(F) or about 1.0*(F). In some embodiments, width (C) may be slightly smaller such that cover 150 is elastically deformed when positioned over mounting panel 110 and may be held in place due at least in part to frictional contact between cover 150 and mounting panel 110.

Referring again to FIG. 9, panel 110 may have an elongate shape, such as a rectangle having a length (L) between opposite ends 114, 116 that is longer than a length (l) between outermost edges of channels 120. In various exemplary embodiments, panel 110 may have a square shape, such that length (L) is approximately equal to length (l), or may have a length (l) between outermost edges of channels 120 that is greater than a length (L) between opposite ends 114 and 116.

Mounting panel 110 and cover 150 may be made from material that provides sufficient rigidity and durability to support and/or accommodate one or more electrical components, for example, while being resilient and bendable without cracking. Alternatively or in addition, mounting panel 110 and cover 150 may be made from a material that is thermally insulating and/or substantially non-conductive. For example, mounting panel 110 may be made from a polyvinyl chloride. In various exemplary embodiments, mounting panel 110 and/or cover 150 may be made from a material including polyvinyl chloride, polyethylene terephthalate, high density polyethylene, low density polyethylene, polypropylene, other polymers, and combinations thereof.

Mounting panel 110 and/or cover 150 may be made from a material that provides shape stability over a range of normal temperatures and becomes soft and pliable at a relatively low temperature. For example, mounting panel 110 and/or cover 150 may be made from a material having a relatively low heat deflection temperature (e.g. as measured according to ASTM D648), such as a heat deflection temperature between 120° F. and 180° F., 130° F. and 160° F., or about 130° F. Such ranges have been found to provide durability and resistance to deformation at low heat levels that may be emitted by various electrical components, while also allowing molding by a user with application of moderate levels of heat. A mounting panel 110 or cover 150 made from a polyvinyl chloride having a relatively low heat deflection temperature facilitates selective heating and shaping of mounting panel 110 and/or cover 150, and the new shape may be retained upon cooling.

Mounting panel 110 and cover 150 may differ in one or more characteristics, such as material, thickness, stiffness, hardness, thermal stability, etc. Mounting panel 110 may be relatively stiffer and/or thicker as compared to cover 150. In an exemplary embodiment, mounting panel 110 and cover 150 are made from the same material, and exhibit different geometry such that mounting panel 110 is relatively stiffer than cover 150. Mounting panel 110 may have a substantially uniform panel thickness (H) between first and second opposite major faces 112, 113, and cover 150 may have a substantially uniform cover thickness (G) that is less than panel thickness (H). Panel thickness (H) may be selected such that mounting panel 110 is substantially shape stable and/or can support one or more components mounted to mounting panel 110, while allowing modification by a user (e.g. such that mounting panel 110 can be readily cut without requiring specialized equipment). In various exemplary embodiments, panel thickness (H) is between 1/16 inch and 1/2 inch, 1/12 inch and 1/4 inch, or about 1/8 inch. Cover thickness (G) may be relatively less thick (e.g. to facilitate customization of cover 150, or to be sufficiently flexible to accommodate mounting panel 110), and in various exemplary embodiments cover thickness (G) may be between 1/32 inch and 1/3 inch, 1/16 inch and 1/4 inch, or about 1/16 inch.

Cover 150 may be substantially resilient and elastically deformable over an appropriate range of deformation. Cover may also be resistant to cracking or breaking. In some exemplary embodiments, cover 150 may be cut without cracking, and may be bendable into at least a 90° angle by the application of heat (e.g. application of heat from a household electric hair dryer).

In some exemplary embodiments, mounting panel 110 and cover 150 may be made from different materials. Mounting panel 110 may be made of a first material and cover 150 may be made from a second material. The first material of mounting panel 110 may be relatively stiffer and/or harder to facilitate mounting and support of one or more components, and the second material of cover 150 may be relatively less stiff and/or less hard to facilitate customization, and/or to readily flex to accommodate mounting panel 110 or another component.

Mounting panel 110 and/or cover 150 may be made in an extrusion process as a continuous profile. Mounting panel 110 may be extruded with a continuous profile to have a desired length. For example, mounting panel 110 may be manufactured with an extended length that may be subsequently cut a user at the time of installation as desired for a particular application. In an exemplary embodiment, mounting panel 110 and/or cover 150 have a length of about five feet. In various exemplary embodiments, mounting panel 110 and/or cover 150 may have a length between about 4 inches and 12 feet, 8 inches and 8 feet, or 1 foot to 6 feet. Similarly, cover 150 may be extruded as a sheet and folded or otherwise shaped to have a desired profile and/or cut to a desired length. In various exemplary embodiments, mounting panel 110 and/or cover 150 may be molded, thermoformed, machined, or otherwise manufactured to have a desired size and profile.

Referring to FIGS. 9 through 13, an exemplary method of installing and using a cable management system is provided. Mounting system 100 includes a mounting panel 110 and cover 150 having first, second and third sides 151, 152, 153. Second and third sides 152, 153 are spaced to accommodate the width of mounting panel 150 such that cover can be positioned over mounting panel 150 with second and third sides 152, 153 adjacent and parallel with channels 120 of mounting panel 110.

Cover 150 facilitates customization by a user of cover 150 into the shape of a five-sided box. Sides 152, 153 may be cut such that cover 150 can be folded to form a fourth side. For example, a user may cut side 152 between edge 156 and first side 155 (e.g. along reference line (I)), and a similar cut may be made along side 153.

Figure 10:
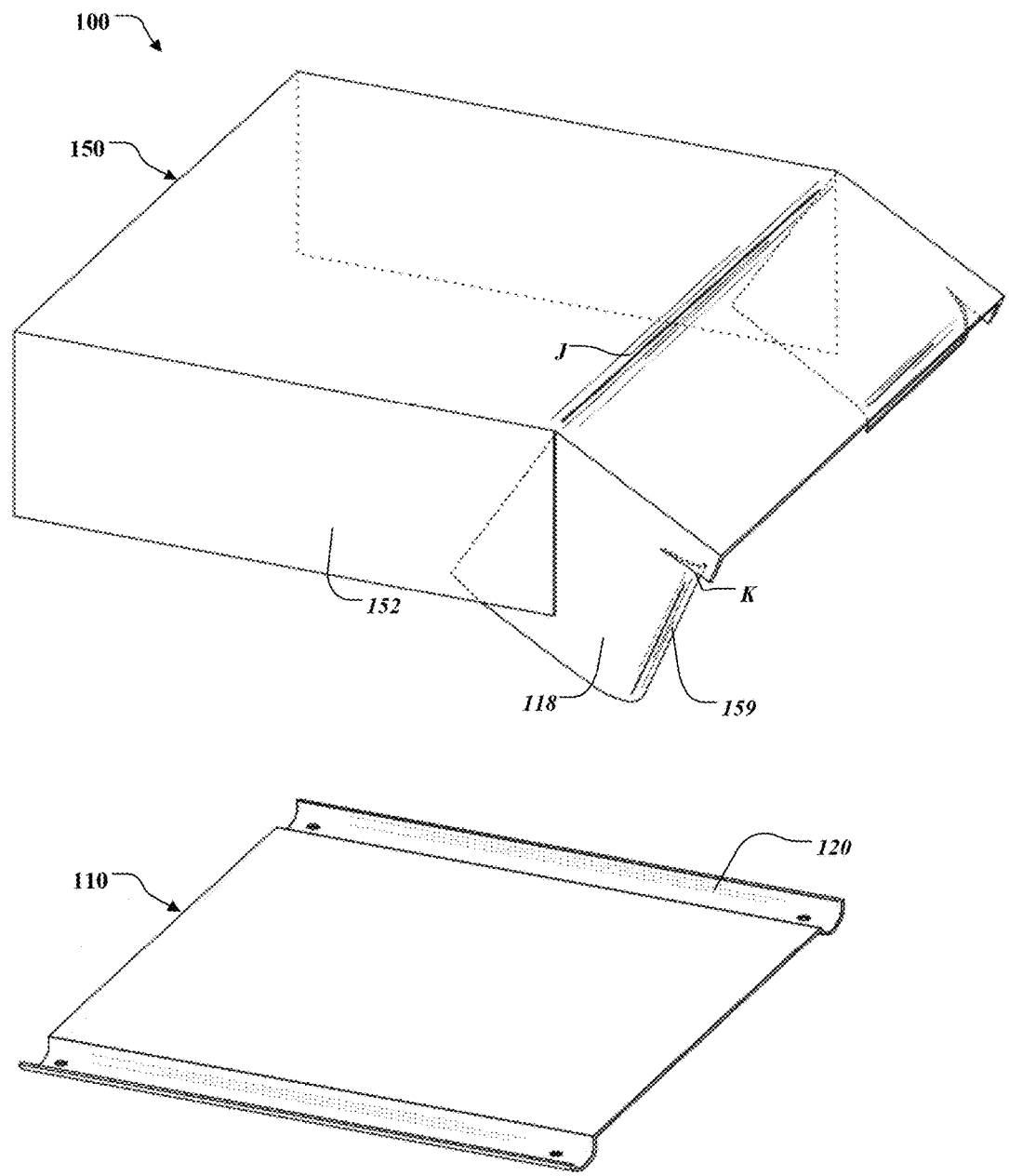
FIG. 10 is an exploded perspective view of the exemplary cover and mounting panel of FIG. 9.
Figure 11:
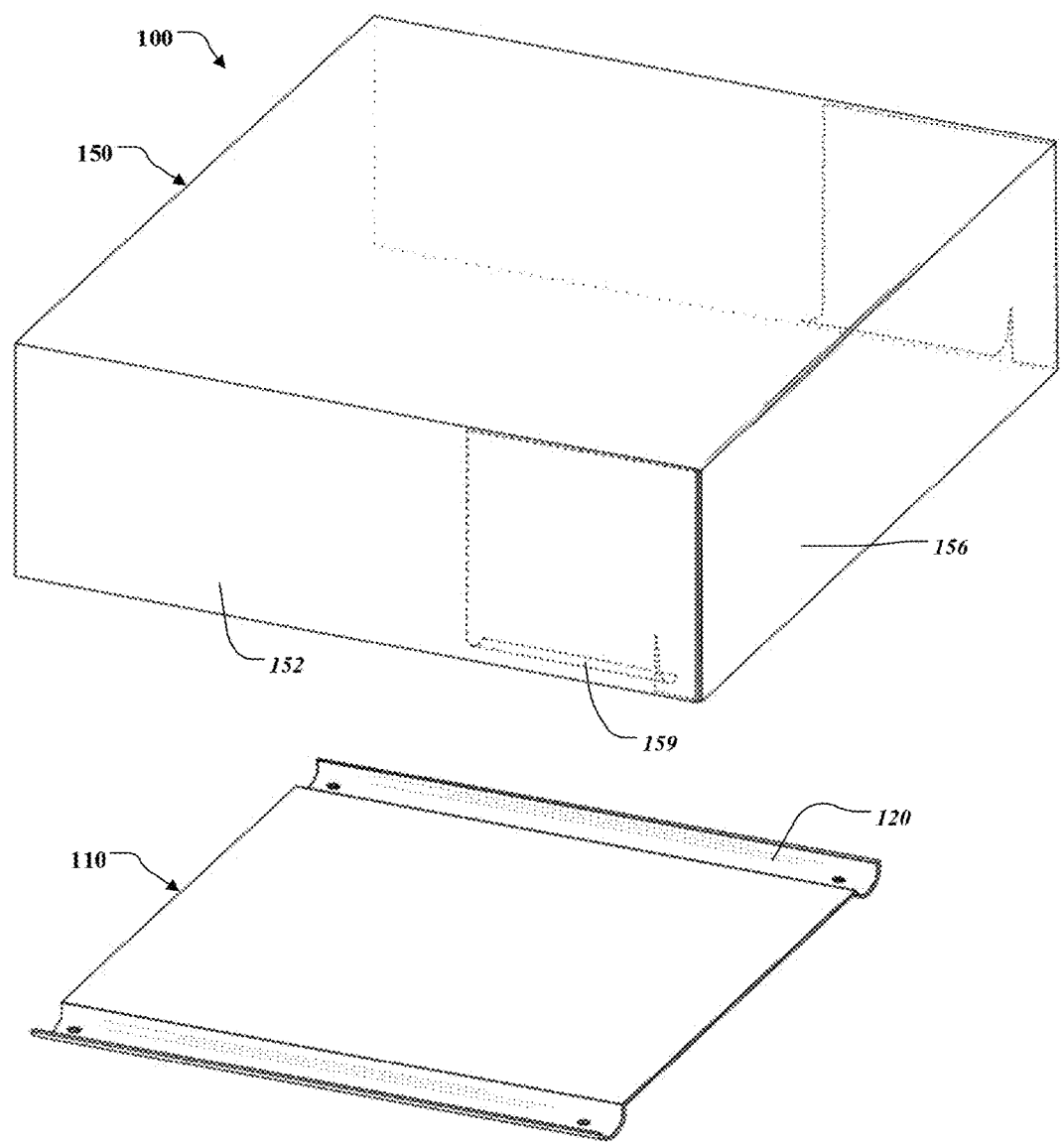
FIG. 11 is an exploded perspective view of the exemplary cover in a folded configuration and the mounting panel of FIG. 9.
Figure 16:
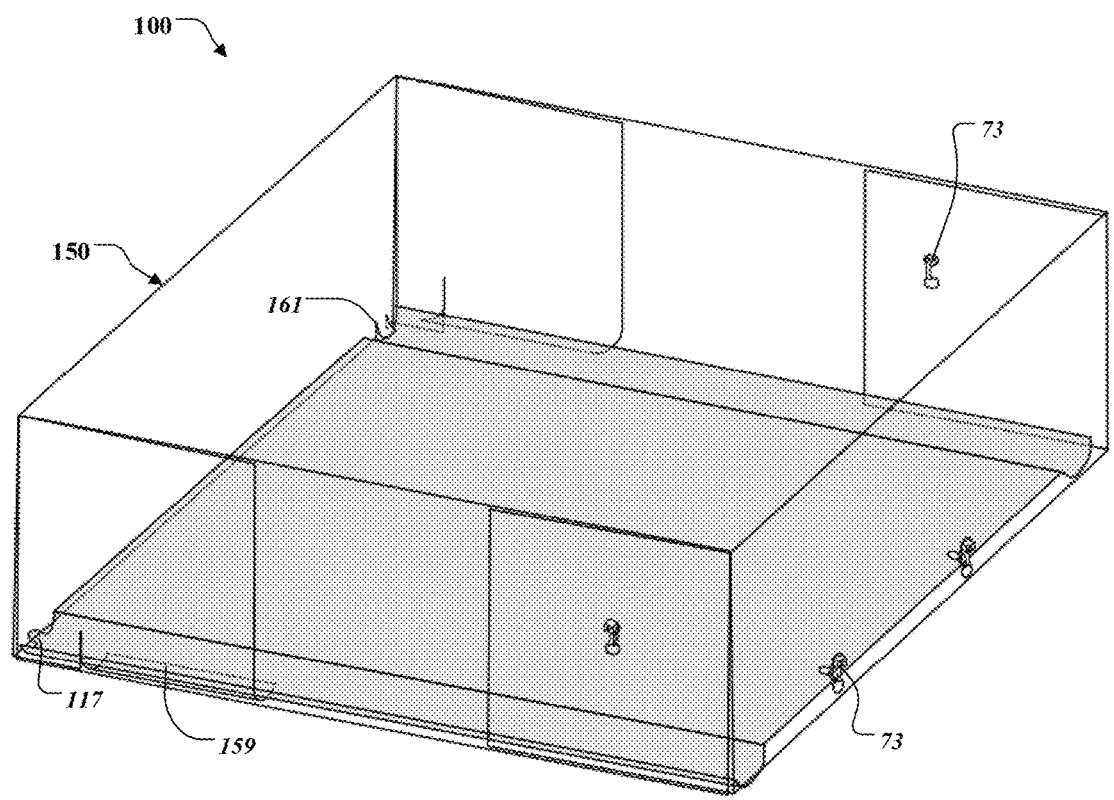
FIG. 16 is a perspective view of another exemplary cover and mounting panel.

Referring to FIG. 10, after cutting sides 152, 153, a user may fold cover 150 (e.g. fold side portions 118 by folding at reference line (J) extending along first side 151 between ends of each cut). In some exemplary embodiments, application of heat along reference line (J) (FIG. 10) facilitates bending of cover 150, and may promote retention of the bent shape upon cooling. The modified cover 150 includes a fourth side 156. An opposite end may be similarly cut and folded such that cover 150 is modified to have a fifth side 155 (FIG. 13). In an exemplary embodiment, cover 150 can be customized to facilitate engagement with mounting panel 110. For example, a user may make cuts along reference line (K). A portion of the resulting flap may be heated and bent under channels 120 to engage mounting panel 110 and retain cover 150 over mounting panel 110 at least in part due to engagement between the curved flap 159 and channels 120, as shown in FIG. 12, for example. Alternatively or in addition, a user may cut one or more slots in sides of cover 150 and fold the material of cover 150 to form tabs, such as tabs 161 (FIG. 16). Tabs 161 may be elastically deformed to contact first face 112 of mounting panel 110. In an exemplary embodiment, mounting panel 110 is thus positioned between the curved flap 159 and tabs 161 of cover 150, retaining cover 150 in position over mounting panel 110 and reducing relative movement between mounting panel 110 and cover 150.

Mounting panel 110 may similarly be modified by a user to include one or more features that interact with cover 150. One or more tabs 117 (FIG. 16) may be formed in mounting panel 110, such as at an end of channels 120, that at least partially support cover 150. Alternatively or in addition, mounting panel 110 and cover 150 may be fastened together by one or more tie-wrap fasteners 73 extending through and/or around portions of mounting panel 110 and cover 150. Similarly, fasteners 73 may extend through cover 150 to assist in retaining cover 150 in a folded configuration.

Figure 14:
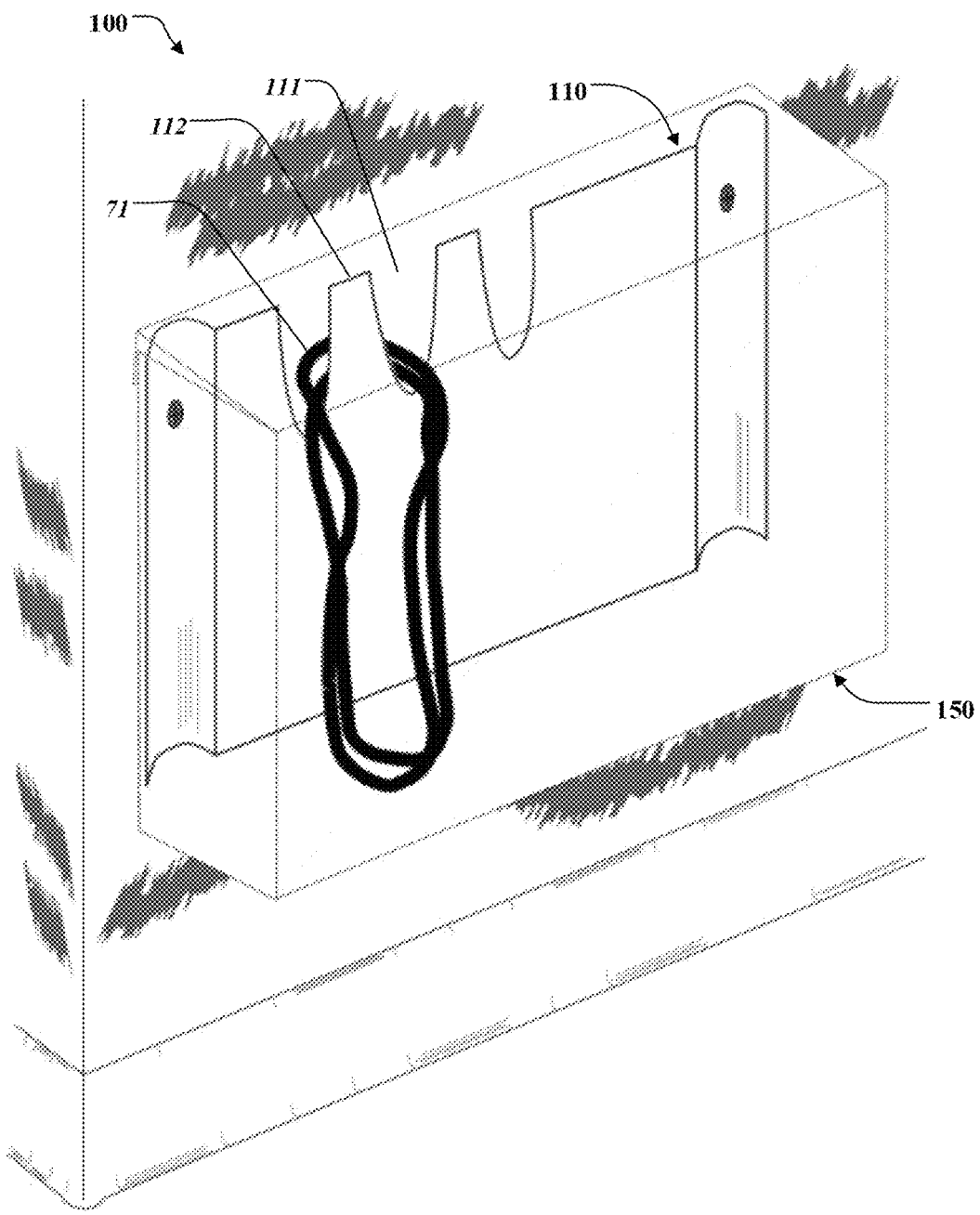
FIG. 14 is a perspective view of an exemplary cover and mounting panel.

Referring to FIG. 14, mounting panel 110 may facilitate customization to accommodate a particular application of mounting system 100. Mounting panel 110 may be modified to include one or more cable management features, such as notches 111 that form hooks 112. A cable 71 may be coiled or otherwise supported by hook 112 in an organized manner, and cover 150 may be positioned over mounting panel 110 and cable 71 to conceal mounting panel 110, cable 71, and/or other contents.

Figure 15:
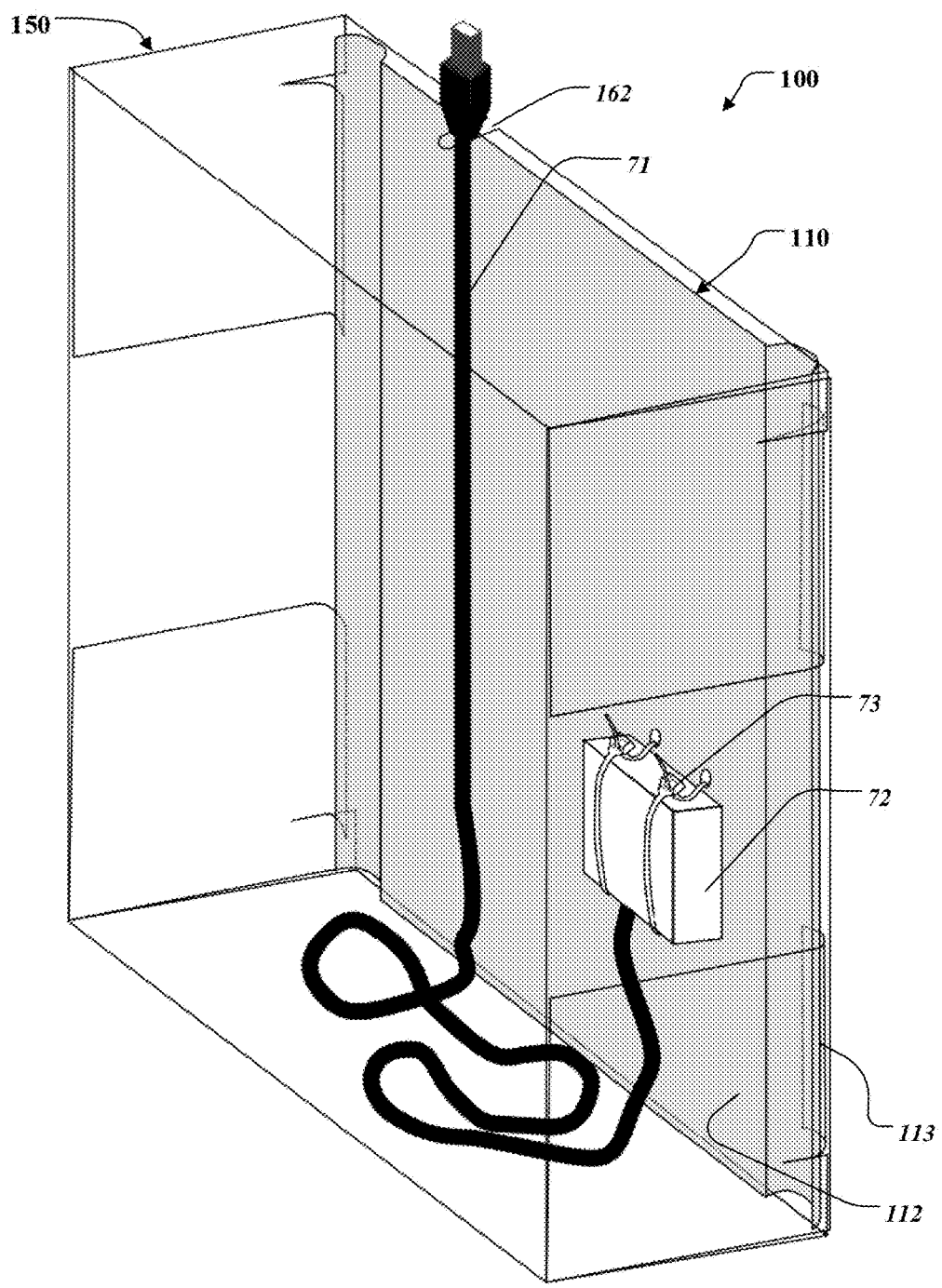
FIG. 15 is a perspective view of another exemplary cover and mounting panel.

Referring to FIG. 15, cover 150 may be customized by a user to facilitate passage of a cable. Cover 150 may include one or more openings, such as notches 162, that facilitate passage of a cable 71. A first end of cable 71 is connected to an electronic component 72 secured to mounting panel 110 by one or more tie-wrap fasteners 73. In various exemplary embodiments, electronic component 72 may be secured to mounting panel 110 by one or more threaded fasteners, snap-fits, adhesive, tape, hook-and-loop fasteners, etc. Mounting panel 110 may be mounted vertically (e.g. such that first and second faces 112, 113 are parallel to the direction of gravity), horizontally (e.g. such that first and second faces 112, 113 are perpendicular to the direction of gravity), or any suitable orientation. An exposed second end of cable 71 may be grasped by a user and connected to an external device, while excess cable 71 may be concealed under cover 150.

Figure 17:
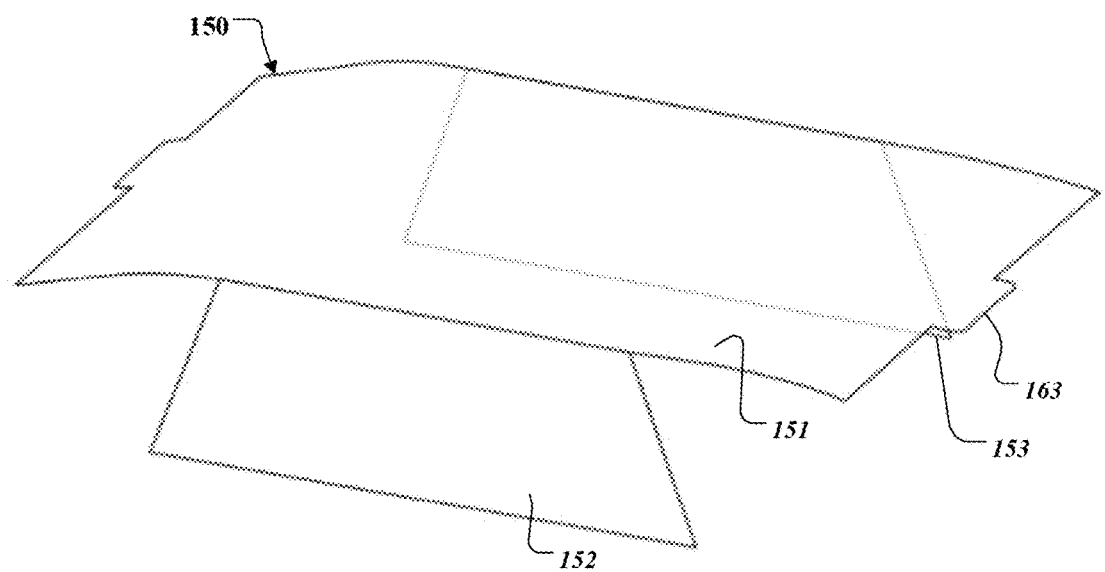
FIG. 17 is a perspective view of an exemplary cover.
Figure 18:
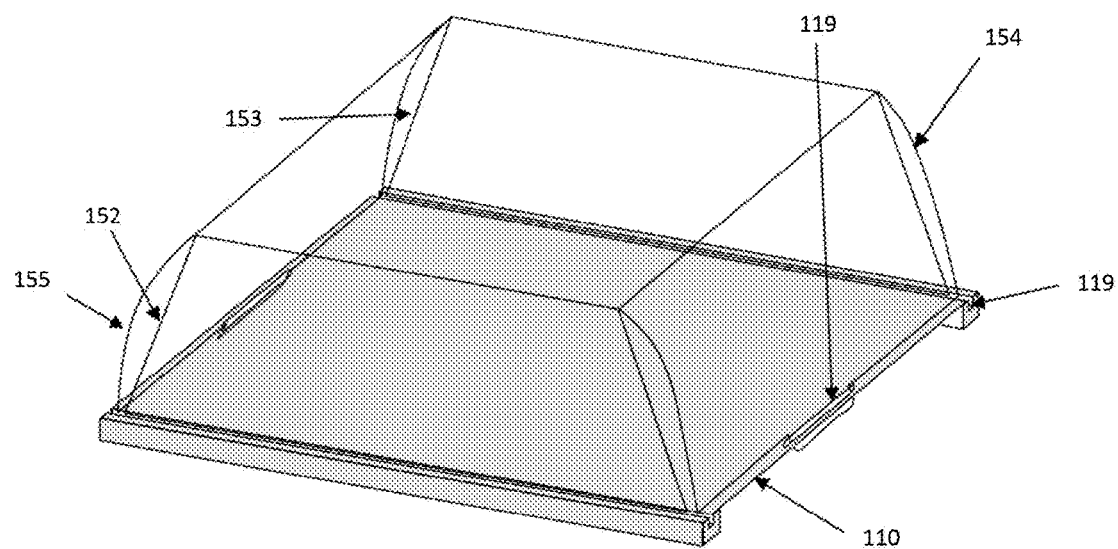
FIG. 18 is a perspective view of an exemplary cover and mounting panel.

Cover 150 may be formed in any suitable shape to provide a desired volume for containing mounting panel 110 and/or one or more components, and/or to provide a desired aesthetic appearance. Referring to FIGS. 17 and 18, second and third sides 152, 153 of cover 150 may be cut into a trapezoidal shape, and have a length shorter than first side 151, such that the extending portions of first side 151 allow bending to create ends of cover 150 (e.g. fourth and fifth sides 154, 155).

Fourth and fifth sides 154, 155 may be retained in a folded configuration proximate mounting panel 110 such that mounting panel 110 and cover 150 provide a trapezoidal mounting system. For example, tabs 163 may be cut along edges of fourth and fifth sides 154, 155 that may be received by complementary grooves 119 of mounting panel 110. In some exemplary embodiments, grooves 119 may extend at least partially along four edges of mounting panel 110 such that each of the second, third, fourth, and fifth sides 151, 152, 153, 154, of cover 150 may be at least partially received by grooves 119. Alternatively or in addition, fourth and fifth sides 154, 155 may be folded at an elevated temperature and cooled to cover 150 in a trapezoidal configuration.

Figure 19:
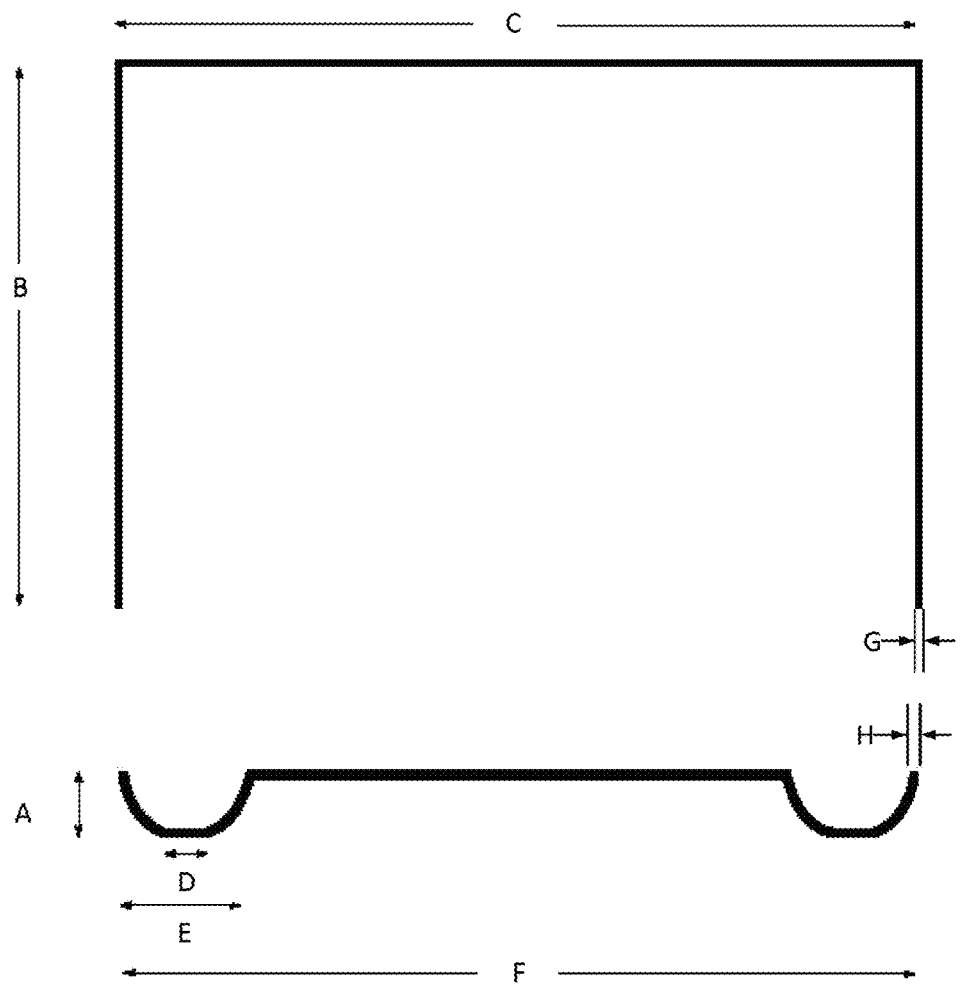
FIG. 19 is an end view of an exemplary cover and mounting panel.

Referring to FIG. 19, an end view of an exemplary mounting system 100 is shown, including mounting panel 110 and cover 150. Mounting panel 110 and cover 150 may have a geometry and configuration that facilitates mounting of an array of components and in a variety of environments. The relative dimensions of mounting panel 110 and cover 110 facilitate a robust mounting system while facilitating customization by an end-user at an installation location. For example, cover 150 may have a size complementary to mounting panel 110 such that cover 150 may be positioned at least partially over mounting panel 110. In an exemplary embodiment, cover 150 has a width (C) that is between about 2 inches and 16 inches, 4 inches and 8 inches, or about 6 inches, and a height (B) between about 1 inches and 12 inches, 2 inches and 6 inches, or about 4 inches. In various exemplary embodiments, cover has a rectangular profile with height (B) smaller than width (C). Width (F) of mounting panel 110 may be similar to width (C) of cover 150. In various exemplary embodiments, width (F) may be between 2 inches and 16 inches, 4 inches and 8 inches, or about 6 inches. In some exemplary embodiments, a suitable width may be selected to facilitate a desired manufacturing process. For example, a width (F) of mounting panel 110 and a width (C) of cover 150 about 6 inches or less may facilitate manufacturing using a continuous extrusion process.

Channels 120 may have a width (E) of about Channels 120 may have a flat or chamfered bottom surface that facilitates consistent contact with a support surface. In various exemplary embodiments, a width (D) of flat bottom surface of channel 20 is between 0 inches and 1 inch, 01. inch and 0.5 inches, or about 1 inch. Channel 20 can be constructed such that width (D) has a predetermined dimensional relationship with channel width (E). For example, width (D) may be less than width (E), and may be between 0*(E) and 1*(E), 0.1*(E) and 0.5*(E), or about 1/3*(E). Such a ratio of channel widths may facilitate stable and consistent contact with a surface while providing a curved appearance.

Figure 20:
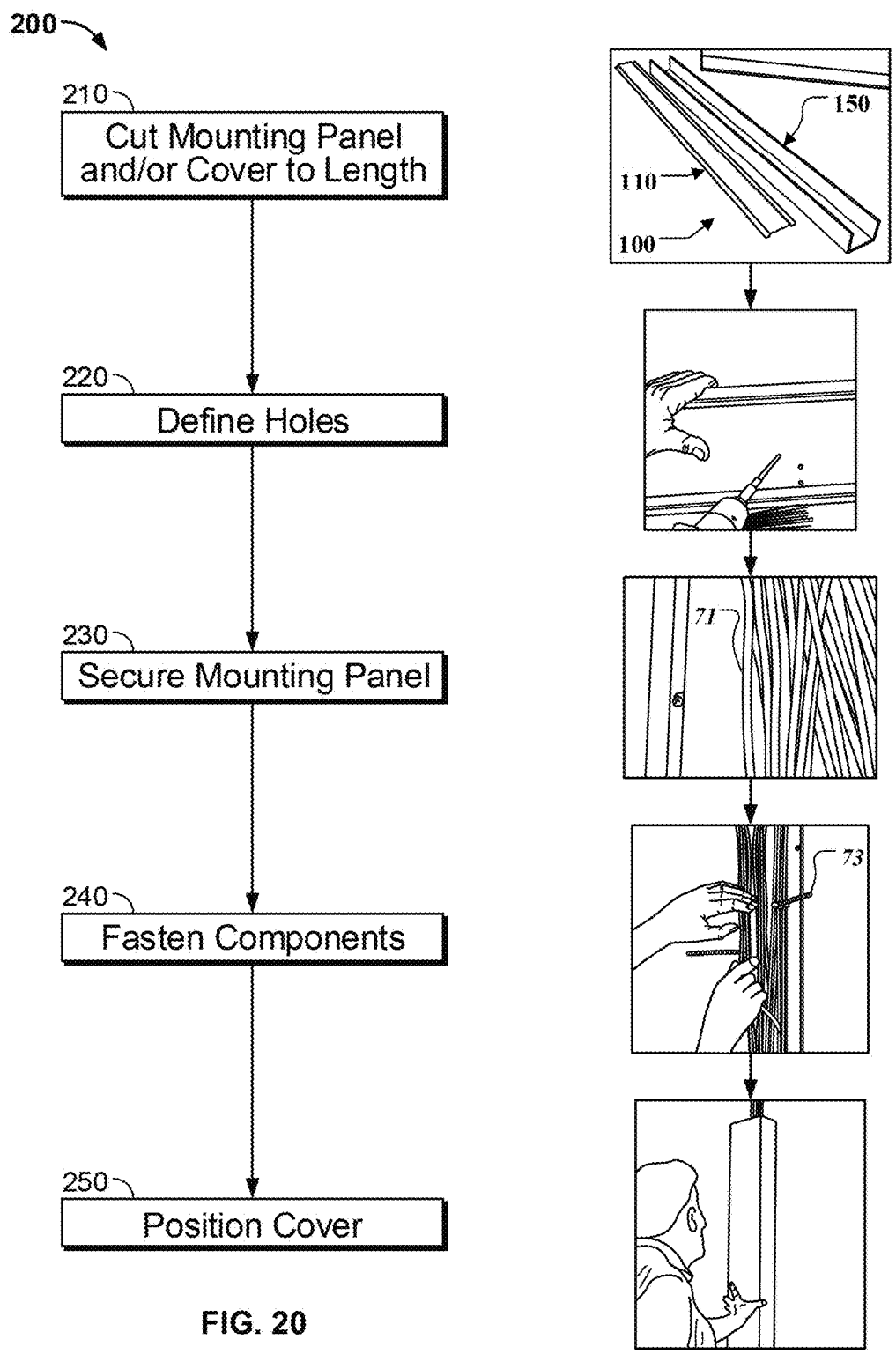
FIG. 20 is a flowchart of an exemplary method of using a cover and mounting panel.

Various exemplary mounting systems described herein facilitate modification and customization by a user to accommodate a particular application. In various exemplary embodiments, a mounting system may be modified by cutting to a desired length, defining holes, slits or other features, attaching fasteners and other retainers, and/or securing one or more devices, cables, or other components. Referring to FIG. 20, an exemplary mounting system, such as mounting system 100 including mounting panel 110 and cover 150, may be modified according to an exemplary method 200 to provide an enclosure that organizes and conceals one or more cables. For example, exemplary method 200 may include a cutting step 210 of cutting a mounting panel 110 and/or cover 150 to a desired length. Mounting panel 110 and/or cover 150 may be provided to a user having a standard length, such as five feet or another suitable length (e.g. two feet, three feet, four feet, six feet, eight feet, twelve feet). Mounting panel 110 and/or cover 150 may be cut by a user at a location of installation to reduce the length as selected by the user based on the available space for a particular application or a length of a cable or other component to be enclosed by mounting system 100.

Exemplary method 200 may include defining one or more holes through mounting panel 110 and/or cover 150 at step 220. One or more holes defined through first and second faces 112, 113 of mounting panel 110, for example, may facilitate positioning of one or more tie-wrap fasteners, clips, rivets, etc., that can be used to secure a cable and/or other components to mounting panel 110. One or more holes may be created to facilitate secure mounting of panel 110 to a wall or other support surface. Step 220 of defining one or more holes may include creating one or more holes by drilling, punching, cutting, tearing and/or other suitable techniques that allow a hole or opening to be defined through mounting panel 110. Step 220 may further include defining one or more holes through cover 150. For example, one or more holes may be defined to accommodate tie-wrap fasteners, clips, or other components, to provide an opening for a cable to pass through, to mount one or more components, and/or to facilitate attachment with mounting panel 110.

Mounting panel 110 may be secured to a support surface at step 230. For example, mounting panel may be secured to a vertical surface, such as a wall, door, cabinetry, desk, or other surface that can support mounting panel 110, components that may be secured to mounting panel 110, and/or cover 150. Step 230 may include securing mounting panel 110 to a wall using threaded fasteners, such as screws. A user may secure mounting panel 110 to the wall by fastening screws in the wall with heads protruding slightly, and positioning holes defined through mounting panel 110 (e.g. at step 220) over the screw heads to hang mounting panel 110 in position. Alternatively or in addition, fasteners may be driven into the wall through one or more holes of mounting panel 110, or at one or more locations of mounting panel 110 without existing holes. In various exemplary embodiments, step 230 may include securing mounting panel with one or more snap-fit fasteners, tie-wrap fasteners, tapes, adhesives, hook-and-loop fasteners, combinations thereof, and/or other suitable fasteners.

Exemplary method 200 may include fastening components to mounting panel 110 at step 240. For example, step 240 may include fastening cable 71 to mounting panel 110 via tie-wrap fasteners 73 by a user passing tie-wrap fasteners 73 through one or more holes defined in mounting panel 110, and tightening tie-wrap fasteners 73 to draw cables 71 into an organized bundle secured in position along mounting panel 110. Channels 120, for example, maintain first and second faces 112, 113 spaced from the wall to accommodate one or more fasteners passing at least partially between the second face 113 and the wall or other support surface.

Exemplary method 200 may include a step 250 of positioning cover 150 over mounting panel 110 to at least partially conceal mounting panel 110 and cables 71. In an exemplary embodiment, cover 150 has a width and depth that accommodates mounting panel 110 such that cover 150 may be positioned flush with the wall and/or substantially conceal mounting panel 110. Positioning cover 150 may including hanging cover 150. For example, a user may hang cover 150 by one or more tie-wrap fasteners 73. The user may secure tie-wrap fasteners 73 to an upper end of cover 150 and loop tie-wrap fasteners 73 around an edge, notch or other feature of mounting panel 110 such that cover 150 hangs in a desired position over mounting panel 110. Such a configuration may allow a user to readily remove cover 150 (e.g. to access the contents of mounting system 100), and reposition cover 150. Cover 150 may thus be readily removed and repositioned as desired without removing and replacing threaded fasteners, for example. Alternatively or in addition, a step of positioning cover 250 may include retaining cover 150 in position with one or more snap-fit fasteners, tie-wrap fasteners, tape, adhesive, hook-and-loop fasteners, tabs formed in mounting panel 110 and/or cover 150, combinations thereof, and/or other suitable fasteners.

Figure 21:
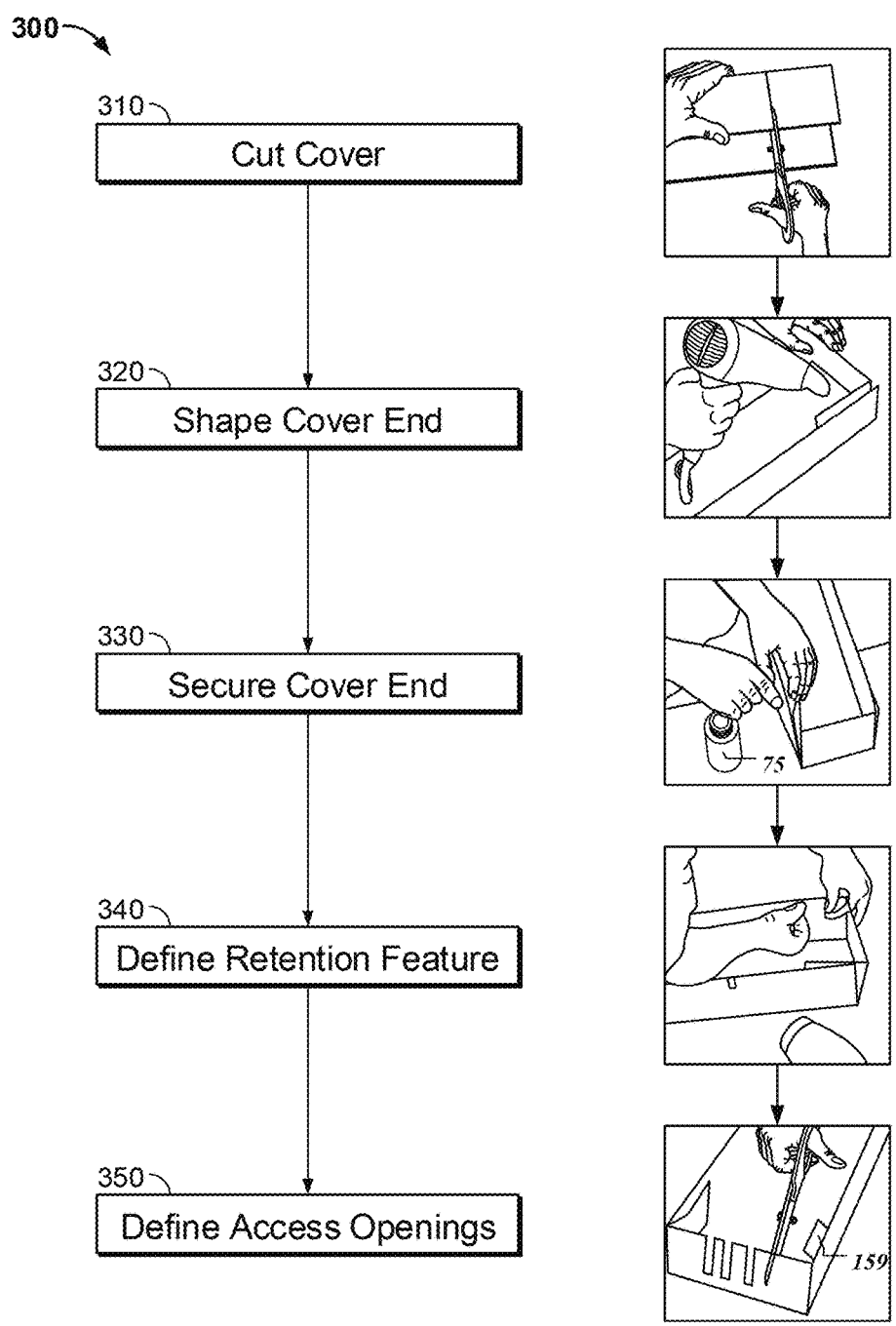
FIG. 21 is a flowchart of an exemplary method of using a cover and mounting panel.

Referring to FIG. 21, mounting panel 110 and cover 150 may be modified according to an exemplary method 300 to provide a mounting system in the configuration of a box that can organize and conceal a cable. For example, a user may fold opposite ends of cover 150 to form fourth and fifth sides such that cover 150 defines a five-sided box. Exemplary method 300 includes cutting slits along second and third sides 152, 153 proximate opposite ends of cover 150. A user may cut slits at a distance from each end equal to the height of cover 150 such that fourth and fifth sides have a height similar to the height of cover 150.

Method 300 includes folding each end inwardly to form the fourth and fifth sides 154, 155 (FIGS. 9-12). Folding of each end may be facilitated by heating cover 150 to soften cover 150. For example, step 320 of molding ends of cover 150 may include heating cover 150 using a household hair dryer, heat gun, hot tap water, or other heat source to elevate the temperature of cover 150 where a user is folding cover 150. A user may apply heat at a temperature less than 140° F. For example, heating cover 150 may include exposing cover 150 to a temperature between 100° F. and 140° F., 110° F. and 130° F., or about 120° F. Such temperature ranges may be attained using readily available household resources, and facilitate molding of cover 150. The user readily plastically deforms cover 150 into the desired shape (e.g. a five-sided box), and cover 150 may substantially retain its new shape upon cooling. In some exemplary embodiments, method 300 may include a further step of securing folded ends of cover 150 into the desired shape. Securing step 330 may include applying adhesive to bond adjacent surfaces of cover 150. For example, a plastic adhesive, such as a PVC pipe adhesive 75, may be applied to bond surfaces of cover 150. Adhesive bonding of cover 150 may be facilitated by a relatively light and thin material forming cover 150.

A user may customize cover 150 to define one or more features that facilitates connection with mounting panel 110. A user may modify cover 150 to provide one or more curved retention tabs 159 that cooperate with channels 120, for example, or other feature of mounting panel 110. Step 340 may include cutting a short slit in the inner flaps in a direction parallel to second and third sides 152, 153, and folding the flap inward to form a curved retention tab. Defining the retention feature may include applying heat to facilitate plastic deformation of cover 150 such that the shape of the curved retention tab 159 may be retained. After forming curved retention tab 159 and allowing to cool, retention tab 159 may resiliently return to its curved shape such that retention tab 159 may flex to accommodate positioning around mounting panel 110, and be biased to a position behind channels 120 of mounting panel 110, for example.

Exemplary method 300 may include defining an access slot through cover 150. A user may accommodate access to one or more cables or other components by defining holes, slots, and/or other passages through cover 150 by drilling, punching, cutting, and/or other suitable techniques that allow a hole or opening to be defined through. A user may position a cable 71, for example, through cover 150 and/or between cover 150 and mounting panel 110, to provide access to a connecting end of cable 71 while excess cable 71 is retained and concealed within cover 151.

Cover 150 modified according to exemplary method 300 may be positioned at least partially around mounting panel 110 to conceal mounting panel 110, cable 71, and/or other components. A user may at least partially secure cover 150 by positioning retention tabs 159 around mounting panel 110. In some exemplary embodiments, modifying cover 150 to form a five sided-box allows mounting panel 110 and/or components secured to mounting panel 110 to be substantially positioned within mounting system 100 and concealed from view.

Figure 22:
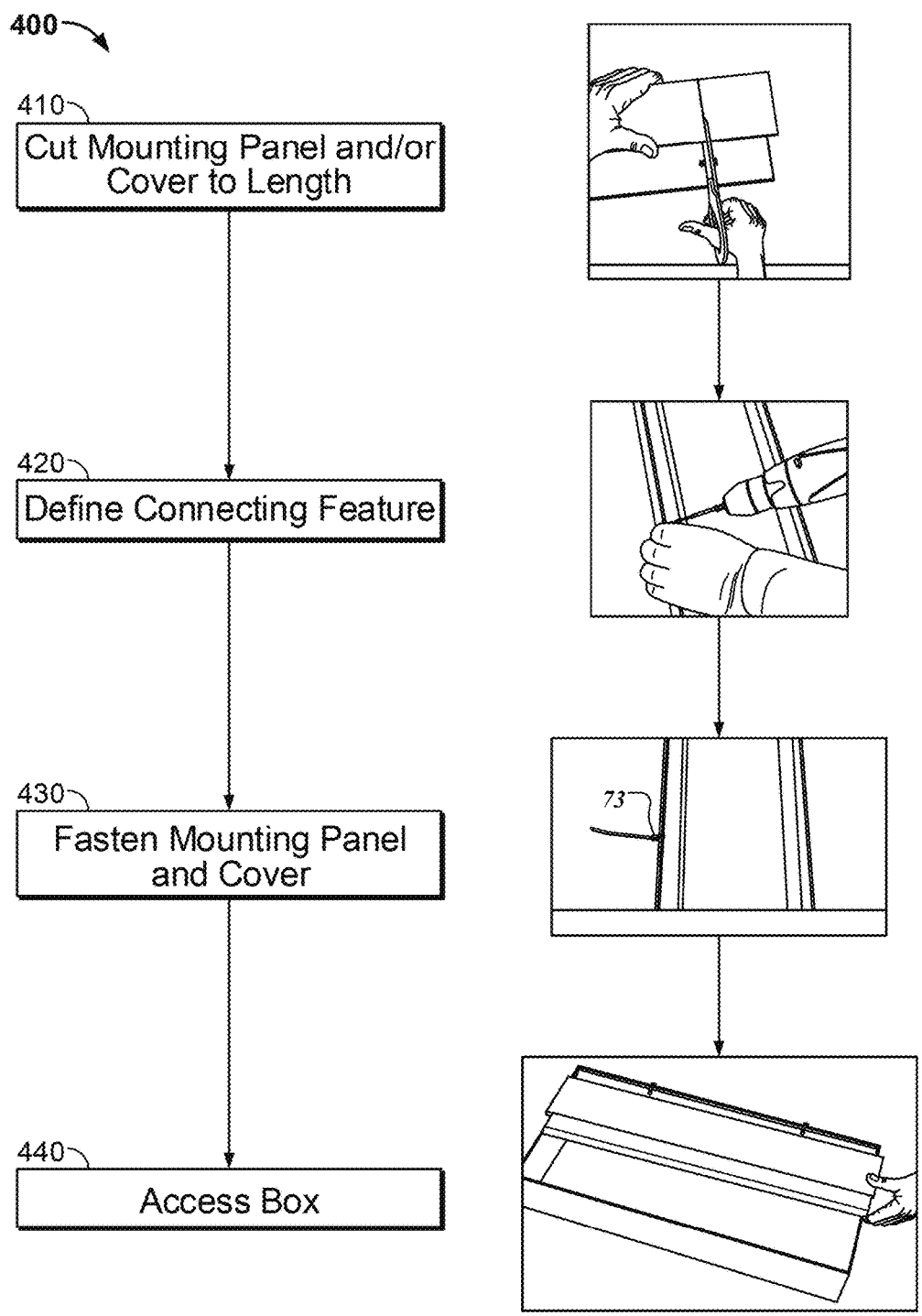
FIG. 22 is a flowchart of an exemplary method of using a cover and mounting panel.

Referring to FIG. 22, an exemplary method 400 is shown of joining mounting panel 110 and cover 150 to form a hinged box. The combined mounting panel 110 and cover 150 may be used to house one or more components, and can be readily opened for access without removing and replacing fasteners, for example. Exemplary method 400 includes a step 410 of cutting mounting panel 110 and cover 150 to a desired length. Mounting panel 110 and cover 150 may be cut to have a substantially equal length (e.g. such that mounting panel 110 may be positioned within cover 150.

Exemplary step 420 may include defining one or more connecting features to facilitate connection between mounting panel 110 and cover 150. In an exemplary embodiment, a user may define one or more connecting features by drilling a hole through mounting panel 110 and cover 150, such as through channel 120 of mounting panel 110 and second side 152 of cover 150. In an exemplary embodiment, mounting panel 110 and cover 150 are provided to the user without connecting features. In some exemplary embodiments, mounting panel 110 and cover 150 free of connecting features may facilitate customization for a particular application without limitation of pre-existing features defined at the time of initial manufacture of mounting panel 110 and cover 150.

Exemplary method 400 may include fastening mounting panel 110 and cover 150. In an exemplary embodiment, mounting panel 110 and cover 150 are hingedly fastened by passing tie-wrap fasteners 73 through openings defined in step 420, and appropriately cinching the fasteners 73 to allow hinged movement between mounting panel 110 and cover 150. Alternatively or in addition, connecting features may include complementary tabs and ridges, snap-fit connectors, rivets, hook-and-loop fasteners, combinations thereof, or other connecting features that allow fastening of mounting panel 110 and cover 150.

Exemplary method 400 thus provides a box defined by mounting panel 110 and cover 150. Mounting panel 110 may define a lid that is hingedly opened, as shown in step 440. Similarly, mounting panel 110 may define a base such that cover 150 may be hingedly opened to access the interior volume. In some exemplary embodiments, mounting panel 110 may be fastened with cover 150 such that cover 150 is raised from a support structure that supports mounting panel 110. In this way, adequate clearance may be provided to allow hinging of cover 150, and or to allow ventilation to an interior of mounting system 100.

Overall, this disclosure provides an organizer panel for securing and managing electronic devices, accessories and cables used for connecting audiovisual systems, telecommunications equipment, computer workstations and peripherals, and like electronic devices. The system advantageously comprises a panel which is supported above a surface with sufficient clearance to pass a tie therethrough. The panel material of construction is readily customized using simple hand tools, as referenced above, which are commonly used by installers of electronic devices, media systems, and computers.

In general, the device and cable management apparatus described herein is deemed generally suitable for mounting to a wall or equipment rack, the interior of a cabinet, or may simply be allowed to rest on the floor. By custom installing devices and accessories, and custom organizing and attaching cables onto the panel (e.g. without use of a box), reduces considerably the time and labor required as compared to threading of cables into a traditional box and affixing them therein. Additionally, a panel without a box can be passed more easily into a cabinet or otherwise positioned or mounted without accommodating the dimensions of a box that would be large enough to contain it.

In this manner, electronic devices, accessories and cables are advantageously accommodated and mounted as a unit without the addition of any appreciable weight or volume as with conventional metallic arrangements. Use of a customizable mounting panel also facilitates inspection during equipment use. Using the arrangement of this disclosure, the user may not only readily install and customize mounting points, e.g., holes, notches, or slots, on the panel and/or the optional cover using hand tools, and fashion their number and arrangement, as needed, but also utilize ties which pass through the customized mounting points in the panel. Unitizing electronic devices, accessories and cables in this manner, it has been found, results in considerable reduction in labor and associated costs as compared to mounting accessories in a metallic electrical box. In addition, enabling cables to be managed in an orderly and unitizing fashion allows the user to easily locate and follow cables visually, e.g., for their connection or disconnection from a selected peripheral device, as compared to collecting cables a trough, a conventional cable management box, or an electrical box.

The mounting panels may be readily customized, modified or replaced, as desired. Mounted items may be removed by the user by simply cutting away the ties, and replaced with new items mounted either by using existing holes or by making new ones for custom mounting of new peripheral devices or remounting existing peripherals in a new way. In this manner, the device mounting panel and cable management apparatus, system and method, according to the disclosure, provides versatility not provided by conventional arrangements which often present specific structures intended for specific tasks, or a one size fits all approach to mounting a wide range of peripheral devices and electronic equipment.

The advantages of the present description include, in some embodiments and without limitation, electronic accessories and cables are contained and housed as a unit without the addition of any appreciable weight. The container can be sized as desired so it does not consume extra volume unnecessarily. Electronics, accessories, and cables may be unitized and organized. In various implementations, a user may cut or form features into the panel or into the cover to provide structures or mounting points to retain cable or devices as the user may devise. The cover can be customized by the user to permit passage of cables in locations and of a size decided by the user by the user cutting notches, slots, or holes in the cover. Multiple cable passages may be utilized to organize the passed cables.

When used as a container or as a cosmetic cover, the cover may be sized by the user to fit the conditions the user may discover in the field, saving the user from having to stock multiple sizes, or use multiple fixed size containers. The containment system provided by the present description may be labor saving over mounting accessories in a metal electrical box.

In various implementations, an exemplary mounting panel and cover facilitate Customization to provide additional cable passages or additional ventilation when additional devices or cables are added within container by cutting with simple hand tools. Cable passages may be added to any side of the system according the present description, which facilitates versatility as compared to metal boxes or other plastic cable management boxes which are formed with specific notches, cut-outs, slots, or knock-outs. Cable passages may be made of a size that is specific to the cable being passed, providing a neat appearance. The cable passage may be sized to prevent the passage of the cable's connector thereby retaining the connector in an exact location while storing and fully concealing its attached cable. The cable passage may be sized by the user in the field with simple cutting implements, to freely pass the cable so as to easily drop by gravity the excess cable into the concealing container, as opposed to other cable passage methods such as rubber grommets or pliable plastic slits or brush bristles which may bind on the cable. The cable passage may be a notch which the cable can easily be dressed through by simply removing the cover from the base plate, as opposed to the cable passage notches in commercially available table boxes which require the removal of plates by screwdriver to install the wire.

In some embodiments, an exemplary system and method is provided for fabricating a plastic enclosure of custom size, one side of which is suited for mounting items, securing them with hardware such as tie-wraps. The user can fashion the size of the enclosure, features for securing the sides of the enclosure together or to a surface, and notches for cable passage through the walls of the enclosure, as needed, with simple hand tools, due to the pliable or otherwise easily worked material, and other features and characteristics of the system.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described herein should not be understood as requiring such separation in all embodiments, and it should be understood that the described program components and systems can generally be integrated together in a single product or packaged into multiple products.

What is claimed is:

1. A cable management system, comprising:
a cover having first, second and third sides, the second and third sides perpendicular to the first side, the cover having a substantially uniform thickness (G); and
a unitary mounting panel comprising first and second major faces and first and second channels extending along opposite edges of the first and second major faces, wherein the opposite edges are shared by the first and second major faces, the unitary mounting panel having a substantially uniform thickness (H);
wherein the thickness (G) of the cover is approximately 1/16 inches and the thickness (H) of the mounting panel is approximately 1/8 inches.

2. The system of claim 1, wherein the cover and the mounting panel are made from an extruded polyvinyl chloride, the cover having a width (C) and the mounting panel having a width (F), wherein width (C) and width (F) are each between 4 inches and 6 inches.

3. The system of claim 2, wherein the cover has a width (C), and width (C) is between 0.9*width (F) and 1.1* width (F).

4. A cable management system, comprising:
a cover having first, second and third sides, the second and third sides perpendicular to the first side, the cover having a substantially uniform thickness (G); and
a unitary mounting panel comprising first and second major faces and first and second channels extending along opposite edges of the first and second major faces, wherein the opposite edges are shared by the first and second major faces, the unitary mounting panel having a substantially uniform thickness (H);

wherein the thickness (G) of the cover is approximately half of the thickness (H) of the mounting panel; and wherein the mounting panel has a width (F) between 4 inches and 6 inches.

5. The system of claim 4, wherein the cover has a heat deflection temperature less than 140° F.

6. The system of claim 4, wherein the cover has a width (C), and width (C) is between 0.9*width (F) and 1.1* width (F).

7. A cable management system, comprising:

a cover having first, second and third sides, the second and third sides perpendicular to the first side, the cover having a substantially uniform thickness (G);

a unitary mounting panel comprising first and second major faces and first and second channels extending along opposite edges of the first and second major faces, the unitary mounting panel having a substantially uniform thickness (H), the first and second major faces separated by the thickness (H);

wherein the thickness (G) of the cover is less than the thickness (H) of the mounting panel; and wherein the first and second channels define a height (A) in a direction parallel to the thickness (H) such that the first and second major faces are configured to be suspended from a support surface supporting the mounting panel by a distance parallel to the height (A) and thickness (H).

8. The system of claim 7, wherein the cover has a heat deflection temperature less than 140° F.

9. The system of claim 8, wherein the cover has a heat deflection temperature between 110° F. and 130° F.

10. The system of claim 9, wherein the mounting panel has a heat deflection temperature between 110° F. and 130° F.

11. The system of claim 7, wherein the cover is free of openings defined through the first, second, and third sides of the cover.

12. The system of claim 7, wherein the mounting panel is free of openings defined through the first and second major faces and the first and second channels of the mounting panel.

13. The system of claim 7, wherein the cover is free of hooks extending from the first, second, and third sides of the cover, and free of openings defined through the first, second, and third sides of the cover, and the mounting panel is free of hooks extending from the first and second major faces and first and second channels of the mounting panel, and free of openings defined through the first and second major faces and the first and second channels of the mounting panel.

14. The system of claim 7, wherein the second and third sides of the cover comprise edges that are substantially parallel and have the uniform thickness (G) along an entire length of the cover, and the cover includes open ends between the second and third sides such that the cover is in the configuration of a three-sided box.

15. The system of claim 14, wherein the mounting panel has outer edges that are substantially parallel and have the uniform thickness (H) along an entire length of the mounting panel.

16. The system of claim 14, wherein the first and second channels have a height (A) in a direction parallel to thickness (H), the height (A) greater than a thickness (H) of the mounting panel such that the first and second major surfaces are configured to be suspended from a support surface supporting the mounting panel.

17. The cable management system of claim 7, wherein the distance is between 1/16 inch and 2 inches.

18. The cable management system of claim 17, wherein the distance is between 1/8 inch and 1/2 inch.

19. The cable management system of claim 18, wherein the distance is about 1/4 inch.

* * * * *